United States Patent
Ichiki

(10) Patent No.: US 8,658,907 B2
(45) Date of Patent: Feb. 25, 2014

(54) CONDUCTIVE FILM AND METHOD FOR PRODUCING THE SAME

(75) Inventor: Akira Ichiki, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 245 days.

(21) Appl. No.: 13/164,276

(22) Filed: Jun. 20, 2011

(65) Prior Publication Data

US 2011/0308846 A1 Dec. 22, 2011

(30) Foreign Application Priority Data

Jun. 18, 2010 (JP) ................................ 2010-139825

(51) Int. Cl.
*H05K 1/09* (2006.01)
*G03F 7/20* (2006.01)

(52) U.S. Cl.
USPC ........................................ 174/257; 430/311

(58) Field of Classification Search
CPC .................................... H05K 1/09; G03F 7/20
USPC ........................................ 174/257; 730/311
See application file for complete search history.

(56) References Cited

U.S. PATENT DOCUMENTS

| 7,829,270 B2 | 11/2010 | Nakahira |
| 7,934,966 B2 | 5/2011 | Sasaki et al. |
| 2008/0251767 A1 * | 10/2008 | Winscom et al. ............. 252/500 |
| 2009/0017277 A1 | 1/2009 | Nakahira |
| 2012/0031746 A1 * | 2/2012 | Hwang et al. ................. 200/5 A |

FOREIGN PATENT DOCUMENTS

| JP | 2006-332459 | | 12/2006 |
| JP | 2007-129205 | | 5/2007 |
| JP | 2007226043 A | * | 9/2007 |
| JP | 2008-158108 | | 7/2008 |
| KR | 2011045800 | * | 5/2011 |
| WO | WO 2006/001461 | | 1/2006 |

* cited by examiner

*Primary Examiner* — Timothy Thompson
*Assistant Examiner* — Charles Pizzuto
(74) *Attorney, Agent, or Firm* — Young & Thompson

(57) ABSTRACT

A conductive film has a transparent support, a first conductive silver image disposed on one main surface of the transparent support, and a second conductive silver image disposed on the other main surface of the transparent support. The first and second conductive silver images are obtained by forming at least one silver halide emulsion layer on each of the surfaces of the transparent support and then exposing and developing the silver halide emulsion layer. The first silver image and the second silver image each contain a net-like structure in a region required to be transparent. The net-like structure comprises thin metal wires having a line width of 10 μm or less, and forms a conductive layer having a sheet resistance of 50 ohm/sq or less.

21 Claims, 12 Drawing Sheets

CONDUCTIVE FILM AND METHOD FOR PRODUCING THE SAME

CROSS-REFERENCE TO RELATED APPLICATION

This application is based upon and claims the benefit of priority from Japanese Patent Application No. 2010-139825 filed on Jun. 18, 2010, of which the contents are incorporated herein by reference.

BACKGROUND OF THE INVENTION

1. Field of the Invention

The present invention relates to a conductive film having a high-resolution-patterned silver image on each side of a transparent support and a method for producing such a conductive film by use of a silver halide emulsion layer.

2. Description of the Related Art

Conventional methods for forming a conductive pattern on each side of a support are described in Japanese Laid-Open Patent Publication Nos. 2008-158108 and 2008-216799, for example.

In Japanese Laid-Open Patent Publication No. 2008-158108, a photosensitive material has a silver halide emulsion layer on each of both sides (A and B sides) of a transparent support. The A and B sides are spectrally sensitized in different spectral sensitization ranges. In a sample 101 used in Examples of the above patent document, an image formed on the A side has a line width of 18 μm, and an image formed on the B side has a line width of 20 μ.

In Japanese Laid-Open Patent Publication No. 2008-216799, an image is formed on each side of a transparent support by an exposure treatment using photomasks that each have a filter layer capable of transmitting a light having a wavelength corresponding to the spectral sensitivity of each side of the support.

In the case of forming a thin wire pattern on each side of the transparent support, when one side (one surface) of the support is exposed, the incident light is diffused in the transparent support thereby to blur an image on the back side of the transparent support disadvantageously.

The silver halide emulsion layer with a spectral sensitivity can be formed by adding a sensitizing dye thereto. However, the dye remains in the layer even after development, so that the dye deteriorates the conductive properties of the developed layer, failing to obtain a desired conductivity.

Furthermore, in a case where the conductive film has the conductive pattern with a large line width as described in Japanese Laid-Open Patent Publication Nos. 2008-158108 and 2008-216799, when the conductive film is superimposed on a touch panel of a display panel of a liquid crystal display device, moire tends to be generated disadvantageously.

SUMMARY OF THE INVENTION

In view of the above problems, an object of the present invention is to provide a conductive film and a method for producing the same, capable of forming a high-resolution conductive pattern on each surface of a transparent support, improving the conductivity of the conductive pattern, and preventing generation of moire in a touch panel.

[1] A conductive film according to a first aspect of the present invention, comprising a transparent support, a first conductive silver image disposed on one main surface of the transparent support, and a second conductive silver image disposed on the other main surface of the transparent support, the first and second conductive silver images being obtained by forming at least one silver halide emulsion layer on each of the surfaces of the transparent support and then exposing and developing the silver halide emulsion layer, wherein the first and second silver images each contain a net-like structure in a region required to be transparent, the net-like structure comprises thin wires having a line width of 10 μm or less, and the net-like structure forms a conductive layer having a sheet resistance of 50 ohm/sq or less.

[2] The conductive film according to the first aspect, wherein the conductive layer has a sheet resistance of 10 ohm/sq or less.

[3] The conductive film according to the first aspect, wherein the first and second silver images each contain the net-like structure and a silver wire electrically connected to the net-like structure, and the silver wire has a width of 10 to 500 μm and a length of 10 mm or more, and has a resistance of 300 ohm or less per 10 mm.

[4] The conductive film according to the first aspect, wherein the silver wire has a resistance of 100 ohm or less per 10 mm.

[5] The conductive film according to the first aspect, wherein the silver halide emulsion layer has a silver/binder volume ratio of 1/1 or more.

[6] The conductive film according to the first aspect, wherein the silver halide emulsion layer has a silver/binder volume ratio of 2/1 or more.

[7] The conductive film according to the first aspect, wherein the silver halide emulsion layer is not substantially spectrally-sensitized and has a surface resistance value (log SR) of 15 or less and an applied silver amount of 5 to 30 g/m$^2$.

[8] The conductive film according to the first aspect, wherein the silver halide emulsion layer has an applied silver amount of 15 to 30 g/m$^2$.

[9] The conductive film according to the first aspect, wherein the silver halide emulsion layer contains silver halide particles, and the surfaces of the silver halide particles are covered with a spectral sensitizing dye at a coverage of 20% or less.

[10] The conductive film according to the first aspect, wherein the silver halide emulsion layer has a surface resistance value (log SR) of 13 or less.

[11] The conductive film according to the first aspect, wherein the net-like structure comprises a lattice pattern containing a plurality of polygons, the lattice pattern has an arrangement pitch of 300 μm or less and a total light transmittance of 80% or more, and a difference between the opening ratio of an effective area on the one main surface of the transparent support, the effective area excluding an outer periphery on which the first silver image is not disposed, and the opening ratio of an effective area on the other main surface of the transparent support, the effective area excluding an outer periphery on which the second silver image is not disposed, is 1% or less.

[12] The conductive film according to the first aspect, wherein the first and second silver images each have a portion that forms an electrode for a touch panel.

[13] A method according to a second aspect of the present invention, for producing a conductive film having a transparent support, a first conductive silver image disposed on one main surface of the transparent support, and a second conductive silver image disposed on the other main surface of the transparent support, the method comprising the steps of forming at least one silver halide emulsion layer on each of the surfaces of the transparent support, exposing the silver halide emulsion layer, and developing the exposed silver halide emulsion layer, wherein the first and second silver images each contain a net-like structure in a region required to be transparent, the net-like structure comprises thin wires having a line width of 10 μm or less, the net-like structure forms a conductive layer having a sheet resistance of 50 ohm/sq or less, and the silver halide emulsion layer on each of the surfaces is not substantially spectrally-sensitized and has a thickness of 4 μm or less, an applied silver amount of 5 g/m² or more, and an applied binder amount of 2.0 g/m² or less.

[14] The method according to the second aspect, wherein the silver halide emulsion layer has an applied silver amount of 15 to 30 g/m².

[15] The method according to the second aspect, wherein the conductive layer has a sheet resistance of 10 ohm/sq or less.

[16] The method according to the second aspect, wherein the first and second silver images each contain the net-like structure and a silver wire electrically connected to the net-like structure, and the silver wire has a width of 10 to 500 μm and a length of 10 mm or more, and has a resistance of 300 ohm or less per 10 mm.

[17] The method according to the second aspect, wherein the silver wire has a resistance of 100 ohm or less per 10 mm.

[18] The method according to the second aspect, wherein the silver halide emulsion layer contains silver halide particles, and the surfaces of the silver halide particles are covered with a spectral sensitizing dye at a coverage of 20% or less.

[19] The method according to the second aspect, wherein the exposing step is carried out using an exposure mask in close contact with the silver halide emulsion layer.

[20] The method according to the second aspect, wherein the silver halide emulsion layer has a high contrast photographic property.

[21] The method according to the second aspect, wherein the silver halide emulsion layer is formed as a substantially uppermost layer.

As described above, in the conductive film and the method for producing the conductive film according to the present invention, the high-resolution conductive pattern can be formed on each surface of the transparent support, the conductivity of the conductive pattern can be improved, and the moire generation can be prevented in a touch panel. The conductive film of the present invention is particularly suitable for a capacitive touch panel.

Furthermore, in a case where the light-transmitting conductive layer containing the net-like structure composed of the thin wires is used in a touch panel sensor, the sensor and a part of a wiring extending from the sensor to the control IC circuit can be simultaneously formed from the silver halide emulsion layer (the precursor of the conductive layer). Thus, a touch panel module can be easily produced.

The above and other objects features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Several embodiments of a conductive film and a conductive film production method according to the present invention will be described below with reference to FIGS. 1 to 12. It should be noted that, in this description, a numeric range of "A to B" includes both the numeric values A and B as the lower limit and upper limit values.

Figure 1:
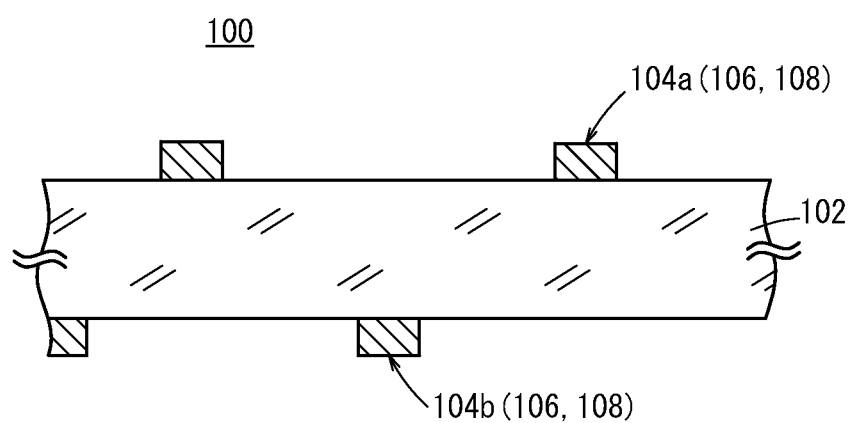
FIG. 1 is a cross-sectional view partially showing a conductive film according to an embodiment of the present invention.

As shown in FIG. 1, a conductive film 100 according to an embodiment of the present invention has a transparent support 102, a first conductive silver image 104a disposed on one main surface of the transparent support 102, and a second conductive silver image 104b disposed on the other main surface of the transparent support 102. The conductive film 100 is produced by forming at least one photosensitive silver halide emulsion layer on each of the surfaces of the transparent support 102 and then exposing and developing the emulsion layer.

Each of the first silver image 104a and the second silver image 104b contains a net-like structure in a region required to be transparent. The net-like structure is composed of thin wires having a line width of 10 μm or less. The net-like structure forms a conductive layer, and the sheet resistance of the conductive layer is 50 ohm/sq or less, preferably 10 ohm/sq or less.

Each of the first silver image 104a and the second silver image 104b further contains silver wires 106 in a region not required to be transparent. The silver wires 106 are electrically connected to the net-like structure, and each have a width of 10 to 500 µm and a length of 10 mm or more. The resistance of the silver wire 106 is 300 ohm or less, preferably 100 ohm or less, per 10 mm.

Figure 3A:
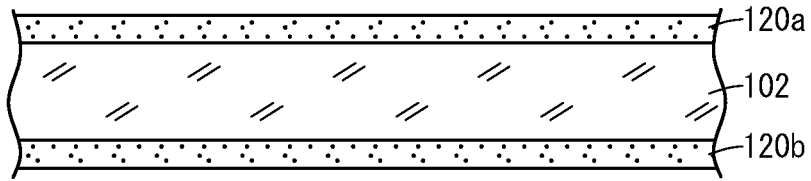
FIG. 3A is a cross-sectional view partially showing a prepared photosensitive material.

The photosensitive silver halide emulsion layer on each surface of the transparent support 102 is not substantially spectrally-sensitized. Thus, for example, as shown in FIG. 3A, the photosensitive silver halide emulsion layer formed on the one main surface of the transparent support 102 (hereinafter referred to as the first photosensitive layer 120a) and the photosensitive silver halide emulsion layer formed on the other main surface of the transparent support 102 (hereinafter referred to as the second photosensitive layer 120b) are not substantially spectrally-sensitized. The first photosensitive layer 120a and the second photosensitive layer 120b have a surface resistance value (log SR) of 15 or less and an applied silver amount (an amount of an applied silver salt) of 5 to 20 $g/m^2$ in silver density. The term "not substantially spectrally-sensitized" means that silver halide particle surfaces are covered with a spectral sensitizing dye at a coverage of 20% or less in the first photosensitive layer 120a and the second photosensitive layer 120b. The first photosensitive layer 120a and the second photosensitive layer 120b preferably have a surface resistance value (log SR) of 13 or less.

When the one main surface is used as the upper surface of the transparent support 102, the first photosensitive layer 120a is formed as the substantially uppermost layer. The term "the substantially uppermost layer" means the uppermost layer in the stuck structure excluding a protective layer, although such a protective layer is generally formed as the uppermost layer.

The volume ratio of silver/binder in each of the first photosensitive layer 120a and the second photosensitive layer 120b is 1/2 or more, preferably 1/1 or more, more preferably 2/1 or more. The silver/binder volume ratio is further preferably 1/1 to 4/1, most preferably 1/1 to 3/1. When the silver/binder volume ratio is within the above range, the electric resistance variation can be reduced even under various applied silver amount, whereby the conductive film 100 for a touch panel, and which has a uniform surface resistance, can be obtained. The silver/binder volume ratio can be determined by converting the silver halide/binder weight ratio of the material to the silver/binder weight ratio, and by further converting the silver/binder weight ratio to the silver/binder volume ratio.

The first photosensitive layer 120a and the second photosensitive layer 120b have a high contrast photographic property exhibiting a gamma of 4 or more in an optical density region of 0.1 to 1.5 on the characteristic curve showing the logarithm of exposure (X-axis) and the optical density (Y-axis) on the orthogonal X and Y coordinate axes with the same unit lengths. The gamma is more preferably 5 to 30, further preferably 5 to 10.

Each of the first silver image 104a and the second silver image 104b has a lattice pattern containing a plurality of polygons. The lattice pattern has an arrangement pitch of 300 µm or less and a total light transmittance of 80% or more. Furthermore, the conductive film 100 has a difference of 1% or less between the opening ratio of the effective area on the one main surface of the transparent support 102 (i.e., the effective area excludes the outer periphery on which the first silver image 104a is not disposed) and the opening ratio of the effective area on the other main surface of the transparent support 102 (i.e., the effective area excludes the outer periphery on which the second silver image 104b is not disposed).

A method for producing the conductive film 100 according to an embodiment of the present invention will be described below with reference to FIGS. 2 to 6.

Figure 2:
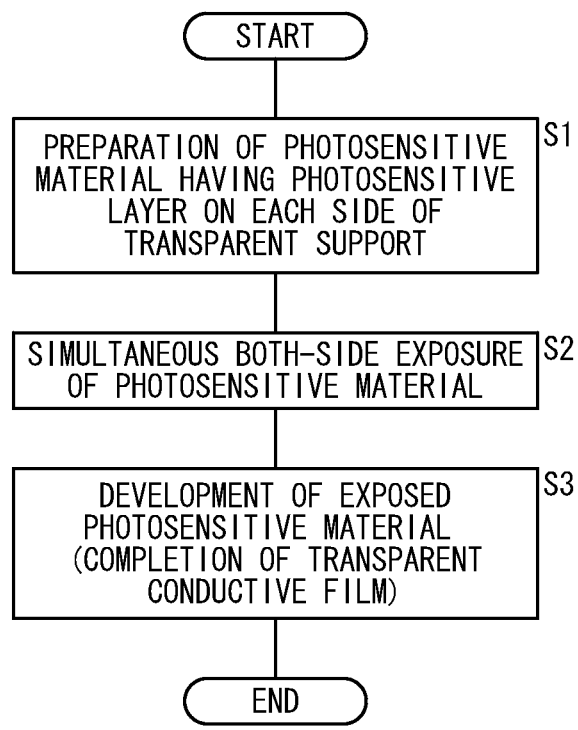
FIG. 2 is a flow chart of a method for producing the conductive film according to an embodiment of the present invention.

First, in step S1 of FIG. 2, a long photosensitive material 122 is prepared. As shown in FIG. 3A, the photosensitive material 122 has the transparent support 102, the first photosensitive layer 120a formed on the one main surface of the transparent support 102, and the second photosensitive layer 120b formed on the other main surface of the transparent support 102.

Figure 3B:
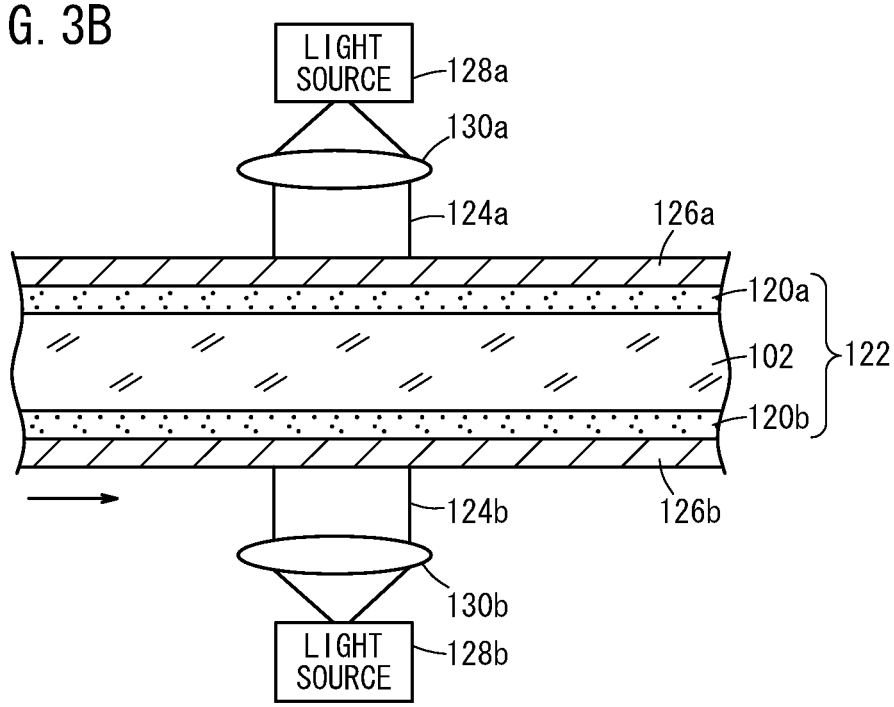
FIG. 3B is an explanatory view showing a simultaneous both-side exposure of the photosensitive material.

In step S2 of FIG. 2, the photosensitive material 122 is exposed. In this exposure step, a simultaneous both-side exposure, which includes a first exposure treatment for irradiating the one main surface of the transparent support 102 with light to expose the first photosensitive layer 120a in a first exposure pattern and a second exposure treatment for irradiating the other main surface of the transparent support 102 with light to expose the second photosensitive layer 120b in a second exposure pattern, is carried out. In the example of FIG. 3B, the first photosensitive layer 120a is irradiated through a first photomask 126a with a first light 124a (a parallel light), and the second photosensitive layer 120b is irradiated through a second photomask 126b with a second light 124b (a parallel light), while the long photosensitive material 122 is conveyed in one direction. The first light 124a is obtained by converting light from a first light source 128a into the parallel light through an intermediate first collimator lens 130a, and the second light 124b is obtained by converting light from a second light source 128b into the parallel light through an intermediate second collimator lens 130b. Though the two light sources (the first light source 128a and the second light source 128b) are used in the example of FIG. 3B, the exposure can be performed using only one light source. In this case, light from the one light source is divided by an optical system into the first light 124a and the second light 124b with which the first photosensitive layer 120a and the second photosensitive layer 120b are irradiated.

Figure 3C:
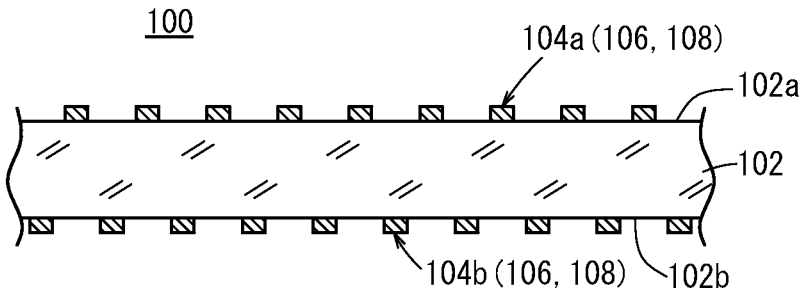
FIG. 3C is a cross-sectional view partially showing a conductive film produced by developing the exposed photosensitive material.

In step S3 of FIG. 2, the exposed photosensitive material 122 is developed to produce the conductive film 100 shown in FIG. 3C. The conductive film 100 has the transparent support 102, the first silver image 104a formed in the first exposure pattern on the one main surface 102a of the transparent support 102, and the second silver image 104b formed in the second exposure pattern on the other main surface 102b of the transparent support 102. Preferred exposure time and development time for the first photosensitive layer 120a and the second photosensitive layer 120b depend on the types of the first light source 128a and the second light source 128b, and the type of developer, etc., and thus cannot be categorically determined. The exposure time and development time may be selected in view of achieving a development ratio of 100%. The first silver image 104a and the second silver image 104b may be subjected to a plating treatment to deposit a conductive metal thereon.

Figure 4:
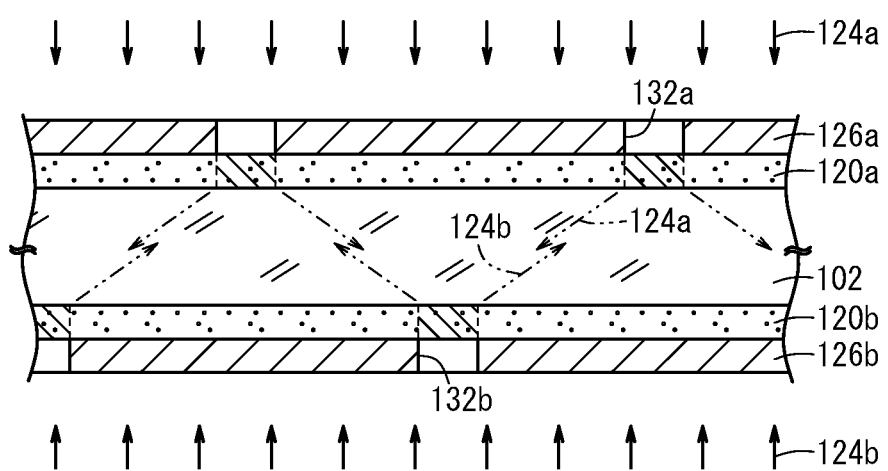
FIG. 4 is an explanatory view showing first and second exposure treatments performed such that a light incident on a first photosensitive layer does not reach a second photosensitive layer and a light incident on the second photosensitive layer does not reach the first photosensitive layer.

As shown in FIG. 4, in the first exposure treatment in the production method of this embodiment, for example, the first photomask 126a is placed in close contact with the first photosensitive layer 120a, the first light source 128a is arranged so as to face the first photomask 126a. Then, the first light 124a is emitted from the first light source 128a toward the first photomask 126a, so that the first photosensitive layer 120a is exposed. The first photomask 126a has a glass substrate composed of a transparent soda glass and a mask pattern (the first exposure pattern 132a) formed thereon. Therefore, in the first exposure treatment, areas in the first photosensitive layer 120a that correspond to the first exposure pattern 132a, are exposed. A space of approximately 2 to 10 µm may be formed between the first photosensitive layer 120a and the first photomask 126a.

Similarly, in the second exposure treatment, for example, the second photomask 126b is placed in close contact with the second photosensitive layer 120b, and the second light source 128b is arranged so as to face the second photomask 126b. Then, the second light 124b is emitted from the second light source 128b toward the second photomask 126b, so that the second photosensitive layer 120b is exposed. The second photomask 126b, as well as the first photomask 126a, has a glass substrate composed of a transparent soda glass and a mask pattern (the second exposure pattern 132b) formed thereon. Therefore, in the second exposure treatment, areas in the second photosensitive layer 120b that correspond to the second exposure pattern 132b in the second photomask 126b, are exposed. In this case, a space of approximately 2 to 10 μm may be formed between the second photosensitive layer 120b and the second photomask 126b.

In the first and second exposure treatments, the emission of the first light 124a from the first light source 128a and the emission of the second light 124b from the second light source 128b may be carried out simultaneously or separately. When the emissions are simultaneously carried out, the first photosensitive layer 120a and the second photosensitive layer 120b can be simultaneously exposed in one exposure step thereby to reduce the exposure time.

When both of the first photosensitive layer 120a and the second photosensitive layer 120b are not spectrally-sensitized, light incident on one side may affect the image formation on the other side (the back side) in the both-side exposure of the photosensitive material 122.

Figure 5:
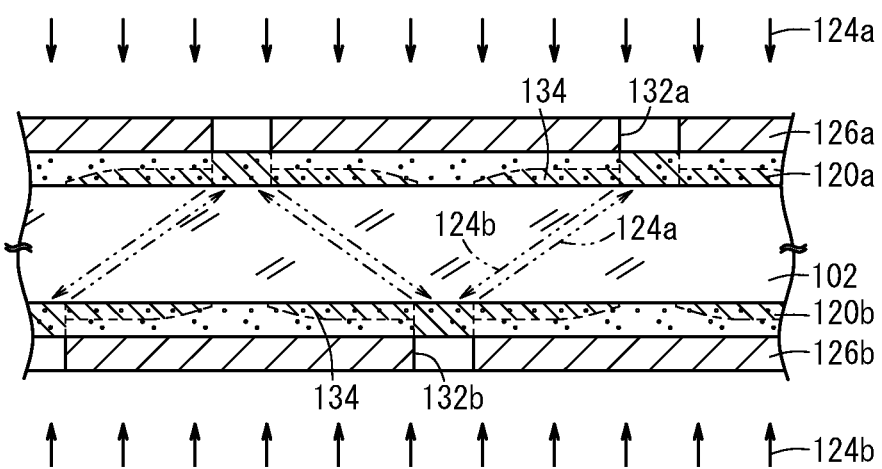
FIG. 5 is an explanatory view showing effects of the lights in a case where the light incident on the first photosensitive layer reaches the second photosensitive layer and the light incident on the second photosensitive layer reaches the first photosensitive layer.
Figure 6:
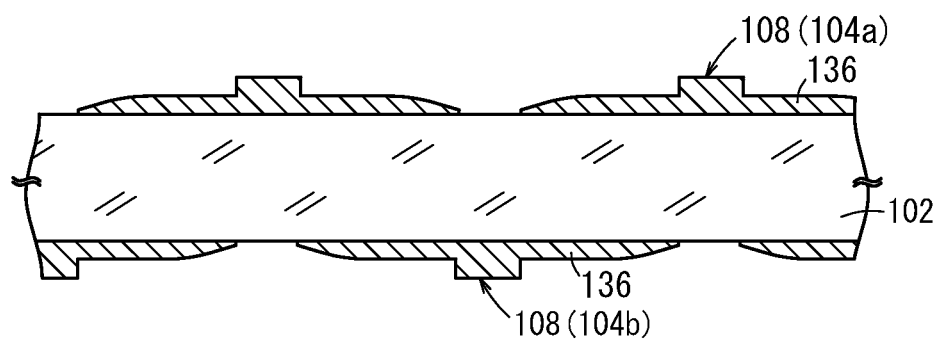
FIG. 6 is an explanatory view showing deteriorated conductive patterns in the case where the light incident on the first photosensitive layer reaches the second photosensitive layer and the light incident on the second photosensitive layer reaches the first photosensitive layer.

Thus, as shown in FIG. 5, the first light 124a from the first light source 128a reaches the first photosensitive layer 120a and is scattered by the silver halide particles in the first photosensitive layer 120a, and part of the scattered light is transmitted through the transparent support 102 and reaches the second photosensitive layer 120b. Then, large areas at the boundary between the second photosensitive layer 120b and the transparent support 102 are exposed thereby to form latent images 134. As a result, the second photosensitive layer 120b is exposed not only to the second light 124b from the second light source 128b but also to the first light 124a from the first light source 128a. As shown in FIG. 6, when the second photosensitive layer 120b is developed to produce the conductive film 100, the conductive patterns 108 (the second silver image 104b) corresponding to the second exposure pattern 132b are formed, and additionally thin conductive layers 136 are formed between the conductive patterns 108 due to the first light 124a from the first light source 128a, so that the desired patterns 108 (corresponding to the second exposure pattern 132b) cannot be obtained.

This is true also for the first photosensitive layer 120a. As shown in FIG. 5, the second light 124b from the second light source 128b reaches the second photosensitive layer 120b and is scattered by the silver halide particles in the second photosensitive layer 120b, and part of the scattered light is transmitted through the transparent support 102 and reaches the first photosensitive layer 120a. Then, large areas at the boundary between the first photosensitive layer 120a and the transparent support 102 are exposed thereby to form latent images 134. As a result, the first photosensitive layer 120a is exposed not only to the first light 124a from the first light source 128a but also to the second light 124b from the second light source 128b. As shown in FIG. 6, when the first photosensitive layer 120a is developed, the conductive patterns 108 (the first silver image 104a) corresponding to the first exposure pattern 132a are formed, and additionally thin conductive layers 136 are formed between the conductive patterns 108 due to the second light 124b from the second light source 128b, so that the desired patterns (corresponding to the first exposure pattern 132a) cannot be obtained.

For example, when such a conductive film 100 is used in a touch panel on a liquid crystal display panel, an image on the display screen may be blocked by the thin conductive layers 136, whereby the touch panel may become unuseful.

This problem may be solved by fixing a dye between the first photosensitive layer 120a and the transparent support 102 and between the second photosensitive layer 120b and the transparent support 102 thereby to suppress the light transmission to the back side. Because the dye deteriorates the transparency of the final product, it is necessary to remove the dye (render the dye harmless) in the development step, for example. On the other hand, in order to achieve a desired conductivity, it is necessary to increase the thicknesses of the first photosensitive layer 120a and the second photosensitive layer 120b. In this case, the dye cannot be easily removed in the development step. Thus, the production process becomes complicated and cannot be readily carried out.

As a result of intense research, it has been found that if the thicknesses or the applied silver amounts of the first photosensitive layer 120a and the second photosensitive layer 120b are selected within a particular range, the incident light can be absorbed by the silver halide per se thereby to suppress the light transmission to the back side. In this embodiment, the thicknesses of the first photosensitive layer 120a and the second photosensitive layer 120b may be 1 to 4 μm. The upper limit is preferably 2.5 μm. Furthermore, the applied silver amounts of the first photosensitive layer 120a and the second photosensitive layer 120b may be 5 to 20 g/m$^2$.

In the above described contact both-side exposure technology, the exposure may be inhibited by dust or the like attached to the film surface thereby to generate an image defect. It is known that the dust attachment can be prevented by applying a conductive substance such as a metal oxide or a conductive polymer to the film. However, the metal oxide or the like remains in the processed product to deteriorate the transparency of the final product, and the conductive polymer is disadvantageous in storage stability, etc. As a result of intense research, it has been found that a silver halide with reduced binder content exhibits a satisfactory conductivity for static charge prevention. Thus, the volume ratio of silver/binder is controlled in the first photosensitive layer 120a and the second photosensitive layer 120b. The silver/binder volume ratios of the first photosensitive layer 120a and the second photosensitive layer 120b are 1/1 or more, preferably 2/1 or more.

As described above, when the thicknesses, the applied silver amounts, or the silver/binder volume ratios of the first photosensitive layer 120a and the second photosensitive layer 120b are controlled, the first light 124a emitted from the first light source 128a to the first photosensitive layer 120a does not reach the second photosensitive layer 120b as shown in FIG. 4. Similarly, the second light 124b emitted from the second light source 128b to the second photosensitive layer 120b does not reach the first photosensitive layer 120a. As a result, in the following development for producing the conductive film 100, as shown in FIG. 1, only the conductive patterns 108 corresponding to the first exposure pattern 132a (the patterns forming the first silver image 104a) are formed on the one main surface of the transparent support 102, and only the conductive patterns 108 corresponding to the second exposure pattern 132b (the patterns forming the second silver image 104b) are formed on the other main surface of the transparent support 102, so that the desired images can be obtained.

In the method for the conductive film according to the present embodiment, the first photosensitive layer 120a and the second photosensitive layer 120b can have both of the satisfactory conductivity and both-side exposure suitability, and the same or different patterns can be formed on the surfaces of the one transparent support 102 by the above exposure. Therefore, for example, electrodes of a touch panel can be easily formed, and the touch panel can be made thinner (smaller).

Furthermore, in the contact both-side exposure technology, the conductive patterns 108 in the first silver image 104a and the second silver image 104b formed in the development step can have a line width of 10 μm or less. When the line width is 10 μm or less, a touch panel obtained by superimposing the conductive film 100 on a display panel of a liquid crystal display device or the like can prevent generation of moire.

An example in which the conductive film 100 according to the present embodiment is applied to a conductive sheet 10 for a touch panel will be described below.

Figure 7:
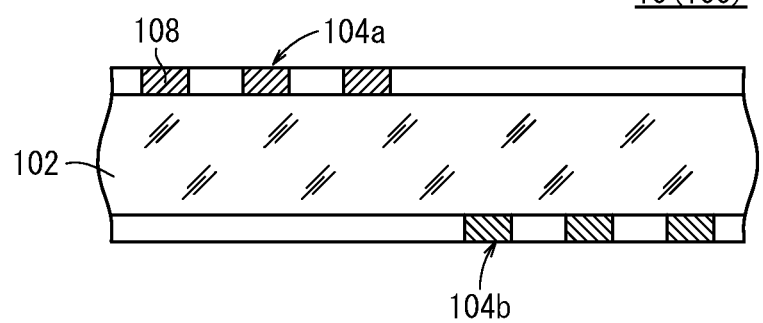
FIG. 7 is a cross-sectional view partially showing a conductive sheet.

As shown in FIG. 7, in the conductive sheet 10, the first silver image 104a and the second silver image 104b are formed respectively on the one main surface 102a and the other main surface 102b of the one transparent support 102 by the one-shot exposure and development. The first silver image 104a has the region required to be transparent (a sensing region 150) and the regions not required to be transparent (a first terminal wiring region 152a shown in FIG. 8 and a second terminal wiring region 152b shown in FIG. 10).

Each of the first silver image 104a and the second silver image 104b contains the net-like structure in the sensing region 150. The net-like structure is composed of thin metal wires having a line width of 10 μm or less. In each of the first silver image 104a and the second silver image 104b, the net-like structure (the conductive layer) has a sheet resistance of 50 ohm/sq or less.

Figure 8:
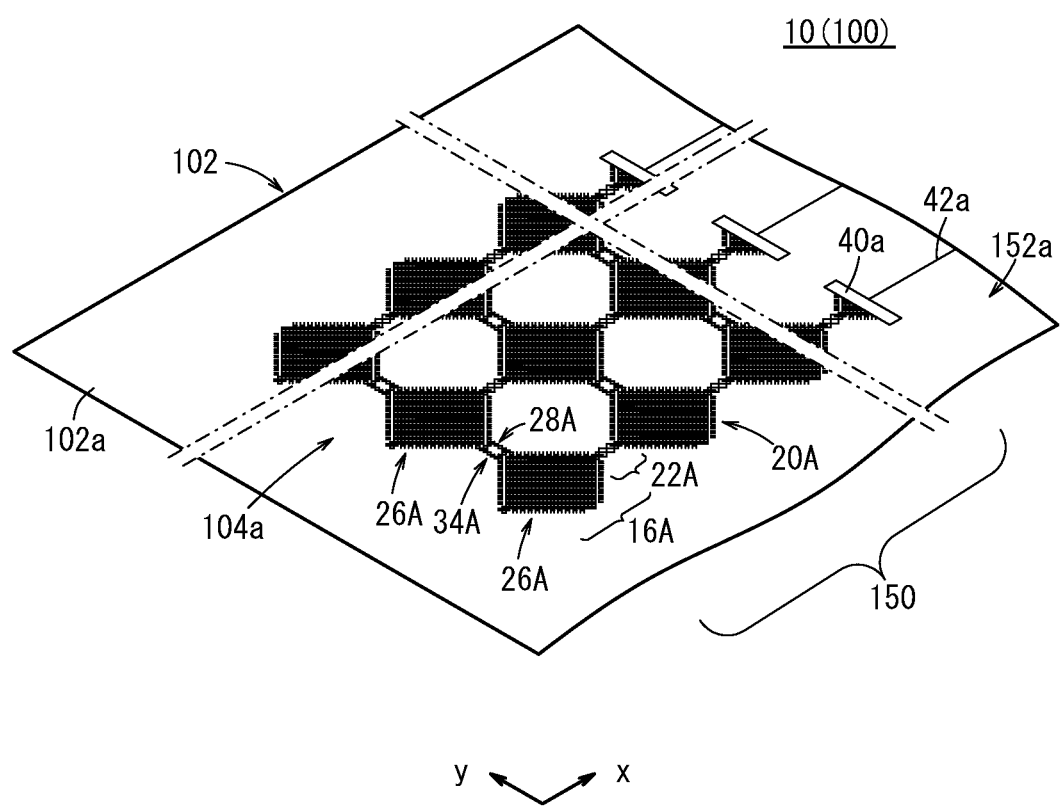
FIG. 8 is a perspective view partially showing an example of a first silver image (conductive patterns) formed on one main surface of a transparent support.

In the first silver image 104a, first terminal wiring patterns 42a in the first terminal wiring region 152a are electrically connected to the net-like structure in the sensing region 150 (see FIG. 8). In the second silver image 104b, second terminal wiring patterns 42b in the second terminal wiring region 152b are electrically connected to the net-like structure (see FIG. 10). The first terminal wiring patterns 42a and the second terminal wiring patterns 42b are composed of metal wires (silver wires) having a width of 10 to 500 μm and a length of 10 mm or more. The resistance of the metal wire (the silver wire) is 300 ohm or less, preferably 100 ohm or less, per 10 mm.

As shown in FIG. 8, in the first silver image 104a, two or more first conductive large lattices 16A are formed in the net-like structure in the sensing region 150 on the one main surface 102a (e.g. the upper surface) of the transparent support 102. The first large lattices 16A each contain a combination of two or more small lattices 1'8 (see FIG. 9). A first dummy pattern 20A (a first unconnected pattern), which is not connected to the first large lattices 16A, is formed near each side of the first large lattices 16A. First connections 22A are formed between the first large lattices 16A, and each adjacent two of the first large lattices 16A are electrically connected by the first connection 22A. The first connections 22A each contain one or more medium lattices 24 (24a to 24d), and the pitch of the medium lattices 24 is n times larger than that of the small lattices 18 (in which n is a real number larger than 1). The small lattices 18 have a smallest square shape.

The side length of the first large lattice 16A is preferably 3 to 10 mm, more preferably 4 to 6 mm. When the side length is less than the lower limit, for example in the case of using the conductive sheet 10 in a touch panel, the first large lattices 16A exhibit a lowered electrostatic capacitance in the detection process, and the touch panel is likely to cause a detection trouble. On the other hand, when the side length is more than the upper limit, the position detection accuracy may be deteriorated. The side length of each small lattice 18 in the first large lattices 16A is preferably 50 to 500 μm, more preferably 150 to 300 μm, for the same reasons. When the side length of the small lattice 18 is within this range, the conductive sheet 10 has high transparency and thereby can be suitably used at the front of a display device with excellent visibility.

The two or more first large lattices 16A are arranged in an x direction (a first direction) with the first connection 22A disposed therebetween, to form one first conductive pattern 26A. Two or more of the first conductive patterns 26A are arranged in a y direction (a second direction) perpendicular to the x direction. Electrically isolated first insulations 28A are disposed between the adjacent first conductive patterns 26A.

Figure 10:
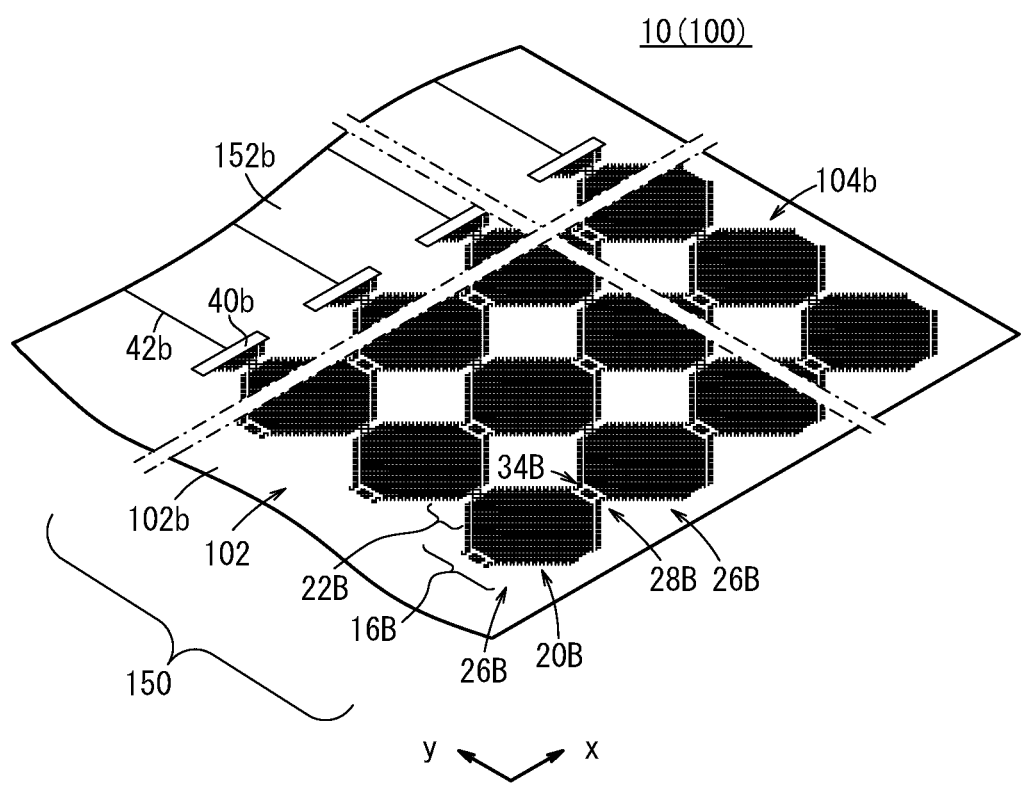
FIG. 10 is a perspective view partially showing an example of a second silver image (conductive patterns) formed on the other main surface of the transparent support.

Meanwhile, as shown in FIG. 10, in the second silver image 104b, two or more second conductive large lattices 16B are formed in the net-like structure in the sensing region 150 on the other main surface 102b (e.g. the back surface) of the transparent support 102. The second large lattices 16B each contain a combination of two or more small lattices 18 (see FIG. 11). A second dummy pattern 20B (a second unconnected pattern), which is not connected to the second large lattices 16B, is formed near each side of the second large lattices 16B. Second connections 22B are formed between the second large lattices 16B, and each adjacent two of the second large lattices 16B are electrically connected by the second connection 22B. The second connections 22B each contain one or more medium lattices 24 (24e to 24h), and the pitch of the medium lattices 24 is n times larger than that of the small lattices 18 (in which n is a real number larger than 1). The side length of the second large lattices 16B is preferably 3 to 10 mm, more preferably 4 to 6 mm, as well as the first large lattice 16A.

The two or more second large lattices 16B are arranged in the y direction (the second direction) with the second connection 22B disposed therebetween, to form one second conductive pattern 26B. Two or more of the second conductive patterns 26B are arranged in the x direction (the first direction). Electrically isolated second insulations 28B are disposed between the adjacent second conductive patterns 26B.

A specific example of the conductive patterns of the first silver image 104a formed on the one main surface 102a of the transparent support 102 and the second silver image 104b formed on the other main surface 102b of the transparent support 102 in the sensing region 150 will be described below.

Figure 9:
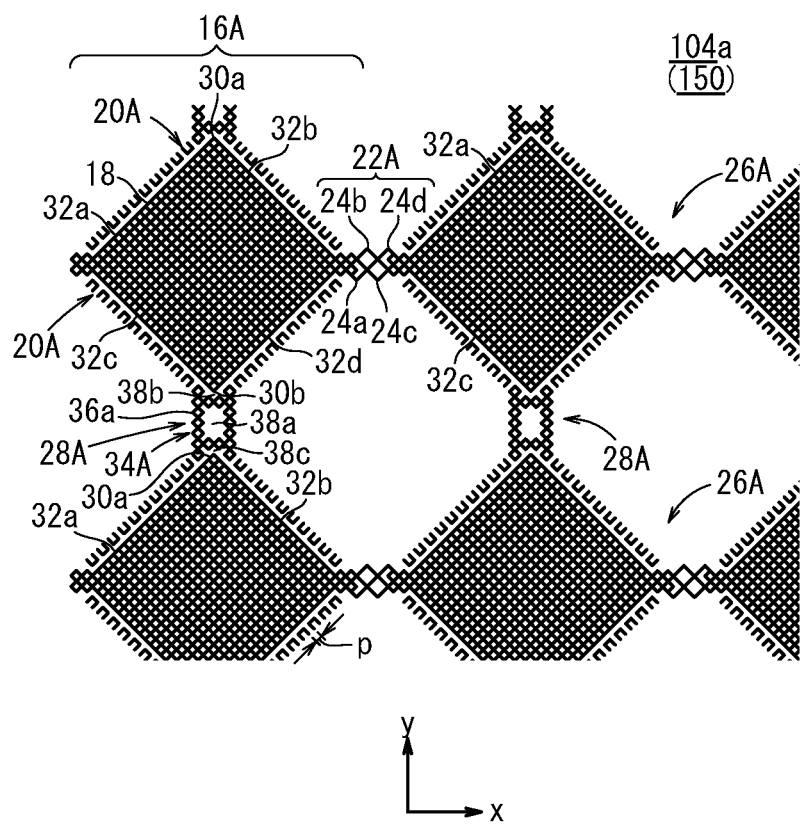
FIG. 9 is a plan view partially showing the conductive patterns of FIG. 8.

As shown in FIG. 9, in the pattern on the one main surface 102a of the transparent support 102 in the sensing region 150, the four sides of the first large lattice 16A each have a straight line shape. Of the four sides, a first side 32a and a second side 32b are on one corner 30a unconnected to the adjacent first large lattice 16A, and a third side 32c and a fourth side 32d are on the other corner 30b unconnected to the adjacent first large lattice 16A. In other words, the intersection of the straight lines of the first side 32a and the second side 32b forms the one corner 30a of the first large lattice 16A, and the intersection of the straight lines of the third side 32c and the fourth side 32d forms the other corner 30b of the first large lattice 16A.

In the first connection 22A, the four medium lattices 24 (the first medium lattice 24a to the fourth medium lattice 24d) are arranged in a zigzag manner, and each of the medium lattices 24 has a size equal to the total size of four small lattices 18. The first medium lattice 24a is disposed at the intersection of the second side 32b and the fourth side 32d, and forms an L-shaped space in combination with one small lattice 18. The second medium lattice 24b is disposed on one side of the first medium lattice 24a, and forms such a square space that four small lattices 18 are arranged in a matrix and the central cross is removed. The third medium lattice 24c is adjacent to one vertex of the first medium lattice 24a and one side of the second medium lattice 24b, and has the same shape as the second medium lattice 24b. The fourth medium lattice 24d is disposed at the intersection of the third side 32c and the first side 32a, is adjacent to one vertex of the second medium lattice 24b and one side of the third medium lattice 24c, and forms an L-shaped space in combination with one small lattice 18 similarly to the first medium lattice 24a. When the small lattices 18 have an arrangement pitch of P, the medium lattices 24 have an arrangement pitch of 2P.

The above described first dummy pattern 20A is formed near each of the four sides of the first large lattice 16A (the first side 32a to the fourth side 32d). The first dummy pattern 20A is formed such that two or more parts each having a shape corresponding to the partially-removed small lattice 18 are arranged along the corresponding straight side. In the example of FIG. 9, the part has a shape obtained by removing one side from the small lattice 18 and thus the shape has two corners and one opening (referred to simply as an approximately U-shape), and ten of the parts are arranged such that the openings are opened in the direction away from the corresponding side of the first large lattice 16A. The arrangement pitch of the parts is twice as large as the arrangement pitch P of the small lattices 18 in the first large lattices 16A. For example, the shortest distance between the straight line shape of the first side 32a and the approximately U-shape of the first dummy pattern 20A is approximately equal to the side length of the inner periphery of the small lattice 18. This is true also for the second side 32b to the fourth side 32d.

In the first insulation 28A, a first insulation pattern 34A unconnected to the first large lattices 16A is formed. The first insulation pattern 34A has a first assembly pattern portion 36a containing two or more small lattices 18 arranged and three spaces 38 (38a to 38c) containing no small lattices 18.

Specifically, the first assembly pattern portion 36a contains a combination of four straight lines composed of a plurality of the small lattices 18 (two long straight lines and two short straight lines). Each of the straight lines is formed by arranging a plurality of the small lattices 18 so as to connect the vertices of the small lattices 18. With respect to the adjacent two first large lattices 16A with the first insulation 28A interposed therebetween, the three spaces 38 include a first space 38a containing no small lattices 18 and which is surrounded by the first assembly pattern portion 36a, a second space 38b containing no small lattices 18 and which is formed near the other corner 30b of one first large lattice 16A, and a third space 38c containing no small lattices 18 and which is formed near the one corner 30a of the other first large lattice 16A.

For example, of the four straight lines, each of the two long straight lines is formed by arranging seven small lattices 18 so as to connect the vertices thereof. The small lattice 18 in one end of one long straight line is positioned adjacent to the first dummy pattern 20A arranged along the third side 32c of the one first large lattice 16A at the same pitch near the other corner 30b of the one first large lattice 16A, and the small lattice 18 in the other end of the one long straight line is positioned adjacent to the first dummy pattern 20A arranged along the first side 32a of the other first large lattice 16A at the same pitch near the one corner 30a of the other first large lattice 16A. Similarly, the small lattice 18 in one end of the other long straight line is positioned adjacent to the first dummy pattern 20A arranged along the fourth side 32d of the one first large lattice 16A at the same pitch near the other corner 30b of the one first large lattice 16A, and the small lattice 18 in the other end of the other long straight line is positioned adjacent to the first dummy pattern 20A arranged along the second side 32b of the other first large lattice 16A at the same pitch near the one corner 30a of the other first large lattice 16A.

Of the two short straight lines, one short straight line contains two small lattices 18 connecting the 2nd small lattice 18 in the one long straight line from the one end and the 2nd small lattice 18 in the other long straight line from the one end. Similarly, the other short straight line contains two small lattices 18 connecting the 2nd small lattice 18 in the one long straight line from the other end and the 2nd small lattice 18 in the other long straight line from the other end.

When the small lattices 18 have an arrangement pitch of P, the first insulation 28A has a width of mP (in which m is an integer of 1 or more). The width of the first insulation 28A is defined as the shortest distance between the adjacent first conductive patterns 26A (i.e. the distance between the other corner 30b of the one first large lattice 16A and the one corner 30a of the other first large lattice 16A). Thus, the first insulation pattern 34A has a maximum length of mP or less in the width direction of the first insulation 28A. The maximum length is the distance between a part in the one short straight line facing the other corner 30b of the one first large lattice 16A and a part in the other short straight line facing the one corner 30a of the other first large lattice 16A.

As shown in FIG. 8, in the above-constructed conductive pattern, in one end of each first conductive pattern 26A, the first connection 22A is not formed on the open end of the first large lattice 16A. In the other end of the first conductive pattern 26A, the end of the first large lattice 16A is electrically connected to the corresponding first terminal wiring pattern 42a by a first wire connection 40a in the first terminal wiring region 152a.

Figure 11:
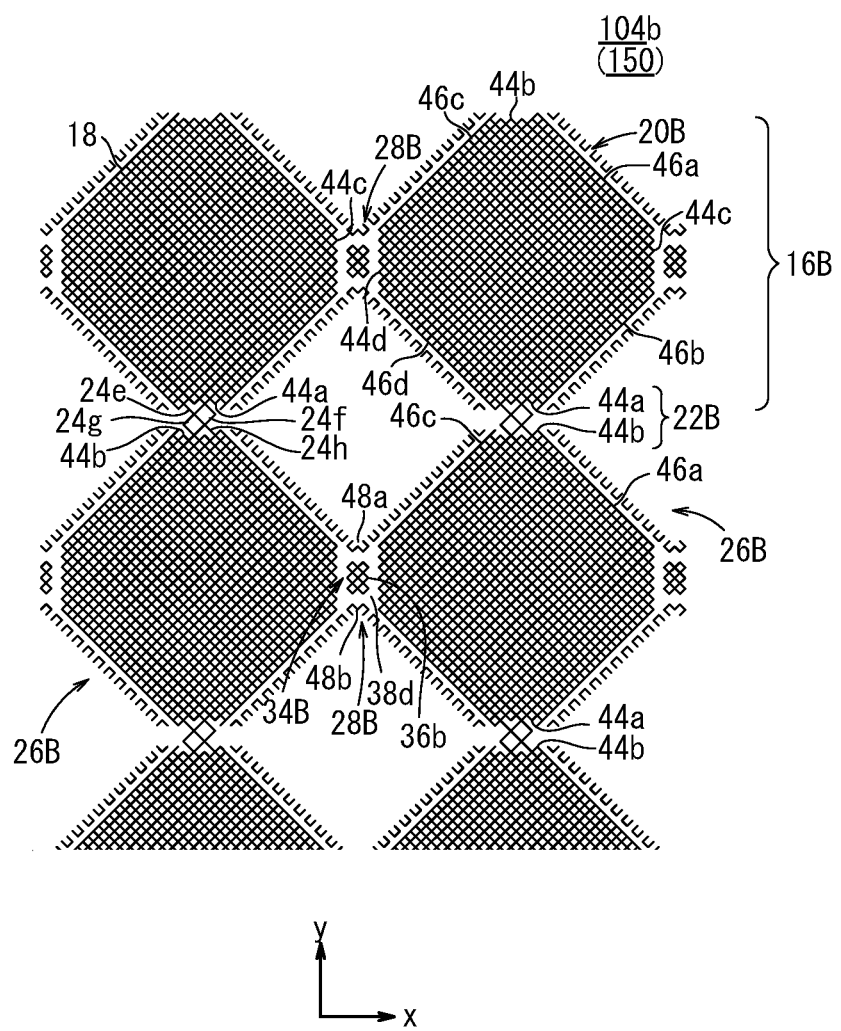
FIG. 11 is a plan view partially showing the conductive patterns of FIG. 10.

As shown in FIG. 11, the second large lattice 16B on the other main surface 102b of the transparent support 102 has an approximately octagonal shape unlike the first large lattice 16A. The second large lattice 16B has four short sides 44 (a first short side 44a to a fourth short side 44d) and four long sides 46 (a first long side 46a to a fourth long side 46d). With respect to the second large lattices 16B which are adjacent to each other in the y direction, the second connection 22B is formed between the first short side 44a of one second large lattice 16B and the second short side 44b of the other second large lattice 16B. With respect to the second large lattices 16B which are adjacent to each other in the x direction, the second insulation 28B is formed between the third short side 44c of one second large lattice 16B and the fourth short side 44d of the other second large lattice 16B.

The four long sides 46 of the second large lattice 16B each have a straight line shape. Of the four long sides 46, the first long side 46a and the second long side 46b are adjacent to the third short side 44c facing one second insulation 28B, and the third long side 46c and the fourth long side 46d are adjacent to the fourth short side 44d facing another second insulation 28B.

In the second connection 22B, the four medium lattices 24 (the fifth medium lattice 24e to the eighth medium lattice 24h) are arranged in a zigzag manner, and each of the medium lattices 24 has a size equal to the total size of four small lattices 18. The fifth medium lattice 24e is disposed on the first short side 44a, and forms an L-shaped space in combination with one small lattice 18. The sixth medium lattice 24f is disposed on one side of the fifth medium lattice 24e, and forms such a square space that four small lattices 18 are arranged in a matrix and the central cross is removed. The seventh medium lattice 24g is adjacent to one vertex of the fifth medium lattice 24e and one side of the sixth medium lattice 24f, and has the same shape as the sixth medium lattice 24f. The eighth medium lattice 24h is disposed on the second short side 44b, is adjacent to one vertex of the sixth medium lattice 24f and one side of the seventh medium lattice 24g, and forms an L-shaped space in combination with one small lattice 18 similarly to the fifth medium lattice 24e. When the small lattices 18 have an arrangement pitch of P, the medium lattices 24 have an arrangement pitch of 2P.

The above described second dummy pattern 20B is formed near each of the four long sides 46 of the second large lattice 16B (the first long side 46a to the fourth long side 46d). The second dummy pattern 20B is formed such that two or more parts each having a shape corresponding to the partially-removed small lattice 18 are arranged along the corresponding straight side. In the example of FIG. 11, the part has a shape formed by removing one side from the small lattice 18 and thus the shape has an approximately U-shape, and ten of the parts are arranged such that the openings are opened in the direction away from the corresponding long side of the second large lattice 16B. The arrangement pitch of the parts is twice as large as the arrangement pitch P of the small lattices 18 in the second large lattices 16B. For example, the shortest distance between the straight line shape of the first long side 46a and the approximately U-shape of the second dummy pattern 20B is approximately equal to the side length of the inner periphery of the small lattice 18. This is true also for the second long side 46b to the fourth long side 46d.

In the second insulation 28B, a second insulation pattern 34B unconnected to the second large lattices 16B is formed. The second insulation pattern 34B has a second assembly pattern portion 36b containing two or more small lattices arranged, a first bend pattern portion 48a and a second bend pattern portion 48b each containing two approximately U-shapes, and a fourth space 38d containing no small lattices 18.

Specifically, the second assembly pattern portion 36b is formed by arranging a plurality of the small lattices 18 in a matrix so as to connect the vertices of the small lattices 18. The number (e.g., six) of the small lattices 18 is such that they can be accommodated in the first space 38a of the first insulation pattern 34A in the first conductive pattern 26A shown in FIG. 9.

The first bend pattern portion 48a has the two approximately U-shapes formed on one end of the second insulation pattern 34B (between the intersection of the fourth short side 44d and the third long side 46c in one second large lattice 16B and the intersection of the third short side 44c and the first long side 46a in another second large lattice 16B). The ends of the two approximately U-shapes are connected, an angle formed by the sides at the ends being approximately 90°.

Similarly, the second bend pattern portion 48b has the two approximately U-shapes formed on the other end of the second insulation pattern 34B (between the intersection of the fourth short side 44d and the fourth long side 46d in the one second large lattice 16B and the intersection of the third short side 44c and the second long side 46b in the other second large lattice 16B). The ends of the two approximately U-shapes are connected, an angle formed by the sides at the ends being approximately 90°.

The fourth space 38d comprises an empty space containing no small lattices 18 and has a shape in which the four straight lines of the first assembly pattern portion 36a in the first insulation pattern 34A shown in FIG. 9 can be accommodated.

When the small lattices 18 have an arrangement pitch of P, the second insulation 28B has a width of nP (in which n is an integer of 1 or more). The width of the second insulation 28B is defined as the shortest distance between the adjacent second conductive patterns 26B (i.e. the distance between the fourth short side 44d of the one second large lattice 16B and the third short side 44c of the other second large lattice 16B). Thus, the second insulation pattern 34B has a maximum length of nP or less, preferably less than nP, in the width direction of the second insulation 28B. The maximum length is the distance between a part facing the fourth short side 44d of the one second large lattice 16B and a part facing the third short side 44c of the other second large lattice 16B in the second assembly pattern portion 36b.

As shown in FIG. 10, in the above-constructed conductive pattern, in one end of each second conductive pattern 26B, the second connection 22B is not formed on the open end of the second large lattice 16B. In the other end of the second conductive pattern 26B, the end of the second large lattice 16B is electrically connected to the corresponding second terminal wiring pattern 42b by a second wire connection 40b in the second terminal wiring region 152b.

Figure 12:
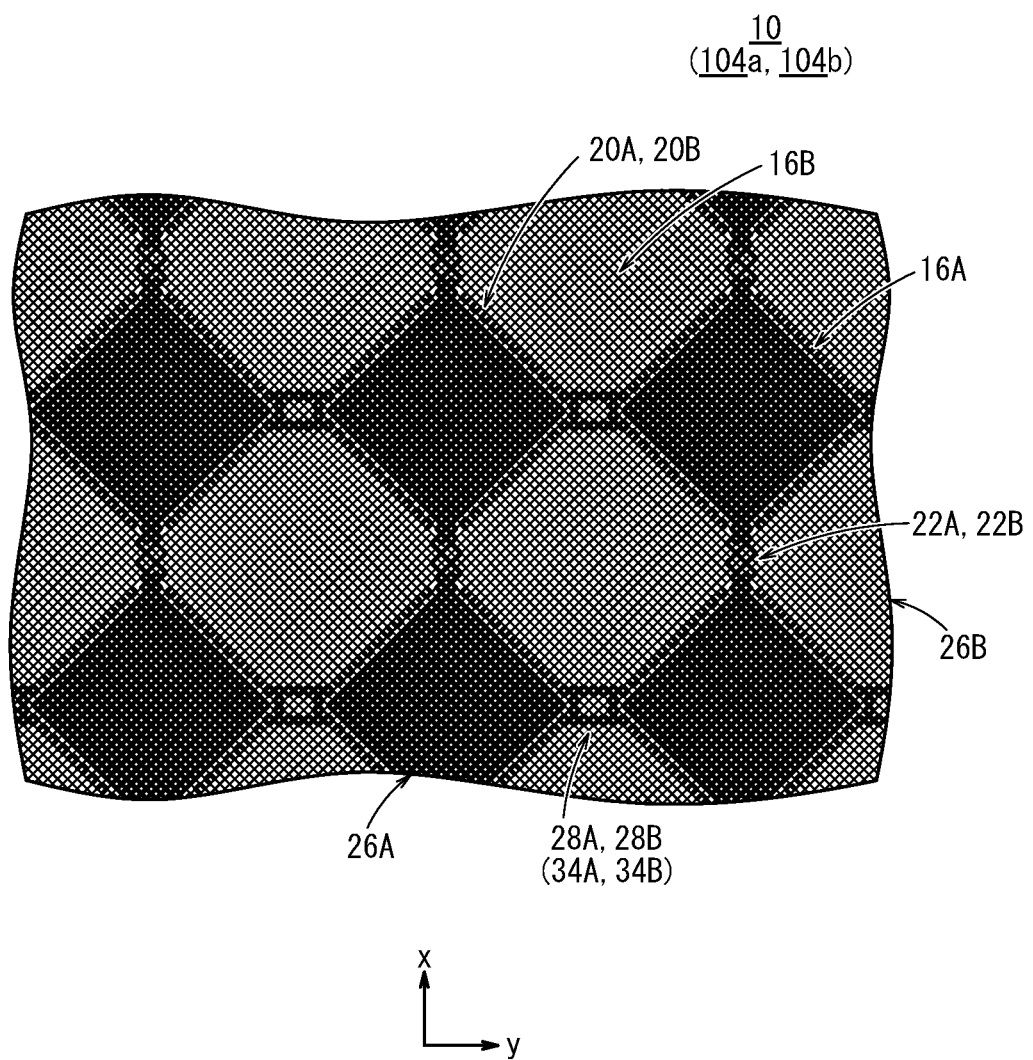
FIG. 12 is a plan view partially showing an example of the conductive sheet from above.

As shown in FIG. 12, the positional pattern relation between the first silver image 104a formed on the one main surface 102a of the transparent support 102 and the second silver image 104b formed on the other main surface 102b thereof is such that the first connections 22A of the first conductive patterns 26A and the second connections 22B of the second conductive patterns 26B are arranged facing each other with the transparent support 102 interposed therebetween, and also the first insulations 28A of the first conductive patterns 26A and the second insulations 28B of the second conductive patterns 26B are arranged facing each other with the transparent support 102 interposed therebetween. Though the first conductive patterns 26A and the second conductive patterns 26B are exaggeratingly shown by thick lines and thin lines respectively in order to clearly represent the positions thereof in FIG. 12, actually they have the same line width.

When the conductive sheet 10 is observed from above, the spaces between the first large lattices 16A are filled with the second large lattices 16B. Thus, the sensing region 150 is covered with the large lattices. In this case, the first dummy patterns 20A and the second dummy patterns 20B overlap with each other to form combined patterns between the first large lattices 16A and the second large lattices 16B. The combined pattern has a width equal to or larger than the side length of the small lattices 18. The width of the combined pattern is defined as the shortest distance projected on the one main surface 102a of the transparent support 102, for example, between the first side 32a of the first large lattice 16A and the second long side 46b (facing the first side 32a) of the second large lattice 16B. In the example of FIG. 12, the width of the combined pattern is twice as large as the side length of the small lattices 18. This is true also for the relations between the second side 32b to the fourth side 32d of the first large lattice 16A and the second long side 46b to the fourth long side 46d of the second large lattice 16B.

Thus, as viewed from above, the openings of the approximately U-shapes in the first dummy patterns 20A along the first large lattices 16A are connected and closed by the straight long sides of the second large lattices 16B, and the bottoms of the approximately U-shapes in the first dummy patterns 20A are connected by the bottoms of the approximately U-shapes in the second dummy patterns 20B along the second large lattices 16B. Similarly, the openings of the approximately U-shapes in the second dummy patterns 20B along the second large lattices 16B are connected and closed by the straight long sides of the first large lattices 16A, and the bottoms of the approximately U-shapes in the second dummy patterns 20B are connected by the bottoms of the approximately U-shapes in the first dummy patterns 20A along the first large lattices 16A. As a result, as viewed from above, a plurality of the small lattices 18 are arranged, and the boundaries between the first large lattices 16A and the second large lattices 16B can hardly be found.

For example, in the case of not forming the first dummy patterns 20A and the second dummy patterns 20B, blank areas corresponding to the combined pattern width are formed, whereby the edges of the first large lattices 16A and the second large lattices 16B are highly visible, resulting in deterioration of the visibility. This problem might be solved by overlapping each side of the first large lattices 16A with the corresponding long side of the second large lattices 16B to prevent the formation of the blank area. However, when the stack position accuracy is slightly deteriorated, the overlaps of the straight lines have large widths (the straight lines are thickened), whereby the boundaries between the first large lattices 16A and the second large lattices 16B are highly visible, resulting in deterioration of the visibility.

In contrast, in this embodiment, the first dummy patterns 20A and the second dummy patterns 20B are stacked in the above manner, whereby the boundaries between the first large lattices 16A and the second large lattices 16B are made less visible to improve the visibility.

When the overlap of the first connection 22A and the second connection 22B is observed from above, the connection point of the fifth medium lattice 24e and the seventh medium lattice 24g in the second connection 22B is positioned approximately at the center of the second medium lattice 24b in the first connection 22A, and the connection point of the sixth medium lattice 24f and the eighth medium lattice 24h in the second connection 22B is positioned approximately at the center of the third medium lattice 24c in the first connection 22A. Thus, the first medium lattice 24a to the eighth medium lattice 24h form a plurality of the small lattices 18 in combination. Therefore, the small lattices 18 are formed by the combination of the first connections 22A and the second connections 22B in the overlaps thereof. Thus formed small lattices 18 cannot be distinguished from the surrounding small lattices 18 in the first large lattices 16A and the second large lattices 16B, so that the visibility is improved.

When the overlap of the first insulation pattern 34A of the first insulation 28A and the second insulation pattern 34B of the second insulation 28B is observed from above, the first assembly pattern portion 36a of the first insulation pattern 34A faces the fourth space 38d of the second insulation pattern 34B, and the first space 38a of the first insulation pattern 34A faces the second assembly pattern portion 36b of the second insulation pattern 34B. Furthermore, the second space 38b of the first insulation pattern 34A faces the first bend pattern portion 48a of the second insulation pattern 34B, and the third space 38c of the first insulation pattern 34A faces the second bend pattern portion 48b of the second insulation pattern 34B. In this case, as viewed from above, the openings of the first bend pattern portion 48a are connected and closed by the straight line shapes of the third side 32c and the fourth side 32d near the other corner 30b of the first large lattice 16A, and the openings of the second bend pattern portion 48b are connected and closed by the straight line shapes of the first side 32a and the second side 32b near the one corner 30a of the first large lattice 16A. Therefore, the first insulation patterns 34A and the second insulation patterns 34B form a plurality of the small lattices 18 in combination. Thus formed small lattices 18 cannot be distinguished from the surrounding small lattices 18 in the first large lattices 16A and the second large lattices 16B, so that the visibility is improved.

When the conductive sheet 10 is used in a touch panel, a protective layer is formed on each of the first silver image 104a and the second silver image 104b, and the first terminal wiring patterns 42a extending from the first conductive patterns 26A in the first silver image 104a and the second terminal wiring patterns 42b extending from the second conductive patterns 26B in the second silver image 104b are connected to an IC circuit such as a scan control circuit. It is preferred that the first wire connections 40a between the first conductive patterns 26A and the first terminal wiring patterns 42a are linearly arranged, and the second wire connections 40b between the second conductive patterns 26B and the second terminal wiring patterns 42b are linearly arranged, whereby the periphery area of the conductive sheet 10 (the frame area around the display screen of the liquid crystal display device) is minimized.

When a finger comes into contact with the protective layer, signals are transmitted from the first conductive pattern 26A and the second conductive pattern 26B corresponding to the finger touch position to the IC circuit. The finger touch position is calculated in the IC circuit based on the transmitted signals. Thus, even when two fingers come into contact with the protective layer simultaneously, the finger touch positions can be detected.

Though the small lattice 18 has a square shape in the above conductive sheet 10, it may have another polygonal shape. Each side of the small lattice 18 may have a straight line shape, a curved shape, or an arc shape. When the small lattice 18 has arc-shaped sides, for example, two opposite sides may have an outwardly protruding arc shape, and the other two opposite sides may have an inwardly protruding arc shape. Alternatively, each side may have a wavy shape containing outwardly protruding arcs and inwardly protruding arcs formed continuously. Of course, each side may have a sine curve shape.

Though the arrangement pitch of the medium lattices 24 in the first connections 22A and the second connections 22B is twice larger than the arrangement pitch P of the small lattices 18 in the above conductive sheet 10, it may be appropriately selected depending on the number of the medium lattices 24. The arrangement pitch of the medium lattices 24 may be 1.5, 3 times, etc. larger than the arrangement pitch P of the small lattices 18. When the arrangement pitch of the medium lattices 24 is excessively small or large, it may be difficult to arrange the first large lattices 16A and the second large lattices 16B, resulting in poor appearance. Thus, the arrangement pitch of the medium lattices 24 is preferably 1 to 10 times, more preferably 1 to 5 times, larger than the arrangement pitch P of the small lattices 18.

Also, the sizes of the small lattices 18 (including the side length and the diagonal line length), the number of the small lattices 18 in the first large lattice 16A, and the number of the small lattices 18 in the second large lattice 16B may be appropriately selected depending on the size and the resolution (the line number) of the touch panel adopting the conductive sheet.

Another preferred method for producing the conductive film according to an embodiment of the present invention by use of a photographic photosensitive silver halide material will be described below.

The method for producing the conductive film 100 according to the present invention includes the following three processes different in the photosensitive materials 122 and development treatments.

(1) A process comprising subjecting a photosensitive black-and-white silver halide material free of physical development nuclei to a chemical or thermal development to form the conductive patterns 108 on the photosensitive material 122.

(2) A process comprising subjecting a photosensitive black-and-white silver halide material having a silver halide emulsion layer containing physical development nuclei to a solution physical development to form the conductive patterns 108 on the photosensitive material 122.

(3) A process comprising subjecting a stack of a photosensitive black-and-white silver halide material free of physical development nuclei and an image-receiving sheet having a non-photosensitive layer containing physical development nuclei to a diffusion transfer development to form the conductive patterns 108 on the non-photosensitive image-receiving sheet.

In the process of (1), an integral black-and-white development procedure is used to form a transmittable conductive film such as a light-transmitting conductive film on the photosensitive material 122. The resulting silver is a chemically or thermally developed silver containing a high-specific surface area filament, and thereby shows a high activity in the following plating or physical development treatment.

In the process of (2), the silver halide particles are melted around and deposited on the physical development nuclei in the exposed areas to form a transmittable conductive film such as a light-transmitting conductive film on the photosensitive material 122. Also in this process, an integral black-and-white development procedure is used. Though high activity can be achieved since the silver halide is deposited on the physical development nuclei in the development, the developed silver has a spherical shape with small specific surface.

In the process of (3), the silver halide particles are melted in the unexposed areas, and are diffused and deposited on the development nuclei of the image-receiving sheet, to form a transmittable conductive film such as a light-transmitting conductive film on the image-receiving sheet. In this process, a so-called separate-type procedure is used, the image-receiving sheet being peeled off from the photosensitive material 122.

A negative or reversal development treatment can be used in the processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "Shashin Kagaku (Photographic Chemistry)", Kyoritsu Shuppan Co., Ltd., 1955 and C. E. K. Mees, "The Theory of Photographic Processes, 4th ed.", Mcmillan, 1977. Though a liquid treatment is generally used in the present invention, also another development treatment such as a thermal development treatment can be utilized. For example, techniques described in Japanese Laid-Open Patent Publication Nos. 2004-184693, 2004-334077, and 2005-010752 and Japanese Patent Application Nos. 2004-244080 and 2004-085655 can be used in the present invention.

The structure of each layer in the conductive film 100 of the above embodiment will be described in detail below.

[Transparent Support 102]

The transparent support 102 may be a plastic film, a plastic plate, a glass plate, etc.

Examples of materials for the plastic film and the plastic plate include polyesters such as polyethylene terephthalates (PET) and polyethylene naphthalates (PEN); polyolefins such as polyethylenes (PE), polypropylenes (PP), polystyrenes, and EVA; vinyl resins; polycarbonates (PC); polyamides; polyimides; acrylic resins; and triacetyl celluloses (TAC).

The transparent support 102 is preferably a film or plate of a plastic having a melting point of about 290° C. or lower, such as PET (melting point 258° C.), PEN (melting point 269° C.), PE (melting point 135° C.), PP (melting point 163° C.), polystyrene (melting point 230° C.), polyvinyl chloride (melting point 180° C.), polyvinylidene chloride (melting point 212° C.), or TAC (melting point 290° C.). The PET is particularly preferred from the viewpoints of light transmittance, workability, etc. The conductive film 100 for the touch panel is required to be transparent, and therefore the transparent support 102 preferably has a high transparency.

[First Photosensitive Layer 120a and Second Photosensitive Layer 120b]

Each of the first photosensitive layer 120a and the second photosensitive layer 120b contains a silver salt and a binder and may further contain a solvent and an additive.

The silver salt used in this embodiment may be an inorganic silver salt such as a silver halide or an organic silver salt such as silver acetate. In this embodiment, the silver halide is used because of its excellent light sensing property.

The applied silver amount (the amount of the applied silver salt) of each of the first photosensitive layer 120a and the second photosensitive layer 120b, in the silver density, is preferably 5 to 30 $g/m^2$, more preferably 8 to 30 $g/m^2$, further preferably 15 to 30 $g/m^2$. When the applied silver amount is within the above range, the exposure of the photosensitive material 122 can be performed such that the first light 124a incident on the first photosensitive layer 120a does not reach the second photosensitive layer 120b and the second light 124b incident on the second photosensitive layer 120b does not reach the first photosensitive layer 120a.

Examples of the binders used in this embodiment include gelatins, polyvinyl alcohols (PVA), polyvinyl pyrolidones (PVP), polysaccharides such as starches, celluloses and derivatives thereof, polyethylene oxides, polyvinylamines, chitosans, polylysines, polyacrylic acids, polyalginic acids, polyhyaluronic acids, and carboxycelluloses. The binders show a neutral, anionic, or cationic property depending on the ionicity of a functional group.

In this embodiment, the amount of the binder in each of the first photosensitive layer 120a and the second photosensitive layer 120b is not particularly limited, and may be appropriately selected to obtain sufficient dispersion and adhesion properties. Each of the first photosensitive layer 120a and the second photosensitive layer 120b preferably has a binder amount of 0.2 to 2 $g/m^2$.

<Solvent>

The solvent used for forming the first photosensitive layer 120a and the second photosensitive layer 120b is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

In this embodiment, in each of the first photosensitive layer 120a and the second photosensitive layer 120b, the ratio of the solvent to the total of the silver salt, the binder, and the like is 30% to 90% by mass, preferably 50% to 80% by mass.

<Other Additives>

The additive used in this embodiment is not particularly limited, and may be preferably selected from known additives. For example, various matting agent may be used to control the surface roughness. It is preferred that the matting agent be dissolved and removed in the development step, whereby it does not deteriorate the transparency of the resultant film.

[Other Layers]

A protective layer (not shown) may be formed on the first photosensitive layer 120a. The protective layer used in this embodiment contains a binder such as a gelatin or a high-molecular polymer, and is disposed on the first photosensitive layer 120a to improve the scratch prevention or mechanical property. The protective layer preferably has a thickness of 0.5 μm or less. The method of applying or forming the protective layer is not particularly limited, and may be appropriately selected from known applying or forming methods. Furthermore, an antihalation layer may be formed between the first photosensitive layer 120a and the transparent support 102 and between the second photosensitive layer 120b and the transparent support 102.

The steps for producing the conductive film 100 will be described below.

[Exposure]

As described above, the photosensitive material 122 having the first photosensitive layer 120a and the second photosensitive layer 120b on the transparent support 102 is subjected to the simultaneous both-side exposure. An electromagnetic wave may be used in the exposure. For example, the electromagnetic wave may be a light such as a visible light or an ultraviolet light, or a radiation ray such as an X-ray. The exposure may be carried out using a light source having a wavelength distribution or a specific wavelength.

[Development]

In this embodiment, the first photosensitive layer 120a and the second photosensitive layer 120b are subjected to the development after the exposure. Common development technologies for photographic silver salt films, photographic papers, print engraving films, emulsion masks for photomasking, and the like may be used in the present invention. The developer used in the development treatment is not particularly limited, and may be a PQ developer, an MQ developer, an MAA developer, etc. Examples of commercially available developers usable in the present invention include CN-16, CR-56, CP45X, FD-3, and PAPITOL available from FUJIFILM Corporation, C-41, E-6, RA-4, D-19, and D-72 available from Eastman Kodak Company, and developers contained in kits thereof. The developer may be a lith developer.

In the present invention, the development step may include a fixation treatment for removing the silver salt in the unexposed areas to stabilize the material. Fixation technologies for photographic silver salt films, photographic papers, print engraving films, emulsion masks for photomasking, and the like may be used in the present invention.

In the fixation treatment, the fixation temperature is preferably about 20° C. to 50° C., more preferably 25° C. to 45° C. The fixation time is preferably 5 seconds to 1 minute, more preferably 7 to 50 seconds. The amount of the fixer used is preferably 600 ml/m$^2$ or less, more preferably 500 ml/m$^2$ or less, particularly preferably 300 ml/m$^2$ or less, per 1 m$^2$ of the photosensitive material 122 treated.

The developed and fixed photosensitive material 122 is preferably subjected to a water washing treatment or a stabilization treatment. The amount of water used in the water washing or stabilization treatment is generally 20 L or less, and may be 3 L or less, per 1 m$^2$ of the photosensitive material 122. The water amount may be 0, and thus the photosensitive material 122 may be washed with storage water.

The ratio of the metallic silver contained in the exposed areas (the conductive patterns) after the development to the silver contained in the areas before the exposure is preferably 50% or more, more preferably 80% or more, by mass. When the ratio is 50% or more by mass, a high conductivity can be achieved.

In this embodiment, the tone (gradation) obtained by the development is preferably more than 4.0, though not particularly restrictive. When the tone is more than 4.0 after the development, the conductive metal portions can exhibit an increased conductivity while the light-transmitting portions maintain a high light transmittance. For example, the tone of 4.0 or more can be obtained by doping with rhodium or iridium ion or by adding a polyethylene oxide derivative to the developer.

(Film Hardening Treatment after Development)

It is preferred that after the first photosensitive layer 120a and the second photosensitive layer 120b are developed, the resultant should be immersed in a hardener and thus subjected to a film hardening treatment. Examples of the hardeners include potash alums, dialdehydes (such as glutaraldehyde, adipaldehyde, and 2,3-dihydroxy-1,4-dioxane), and boric acids, described in Japanese Laid-Open Patent Publication No. 02-141279.

The conductive film 100 is obtained by the above steps. The surface resistance of the resultant conductive film 100 is preferably within the range of 0.1 to 100 ohm/sq. The lower limit is preferably 1 ohm/sq or more, 3 ohm/sq or more, 5 ohm/sq or more, or 10 ohm/sq. The upper limit is preferably 70 ohm/sq or less or 50 ohm/sq or less. When the surface resistance is controlled within this range, the position detection can be performed even in a large touch panel having an area of 10 cm×10 cm or more.

The volume resistivity of the resultant conductive film 100 is preferably 160 μohm·cm or less, more preferably 1.6 to 16 μohm·cm, further preferably 1.6 to 10 μohm·cm.

[Calender Treatment]

In the production method of this embodiment, the developed conductive patterns 108 may be subjected to a smoothing treatment. The conductivity of the conductive pattern 108 can be significantly increased by the smoothing treatment. When the areas of the conductive patterns 108 and the light-transmitting portions in the first silver image 104a and the second silver image 104b are appropriately designed, the resultant touch panel conductive film 100 can be excellent in both of conductivity and visibility.

The smoothing treatment may be carried out using a calender roll unit. The calender roll unit generally has a pair of rolls. The smoothing treatment using the calender roll is hereinafter referred to as the calender treatment.

The roll used in the calender treatment may be composed of a metal or a plastic (such as an epoxy, polyimide, polyamide, or polyimide-amide). Particularly in a case where the photosensitive material has the emulsion layer on each surface, it is preferably treated with a pair of the metal rolls. In a case where the photosensitive material has the emulsion layer only on one surface, it may be treated with the combination of the metal roll and the plastic roll in view of wrinkling prevention. The lower limit of the line pressure is preferably 1960 N/cm (200 kgf/cm, corresponding to a surface pressure of 699.4 kgf/cm$^2$) or more, more preferably 2940 N/cm (300 kgf/cm, corresponding to a surface pressure of 935.8 kgf/cm$^2$) or more. The upper limit of the line pressure is 6880 N/cm (700 kgf/cm) or less.

The smoothing treatment such as the calender treatment is preferably carried out at a temperature of 10° C. (without temperature control) to 100° C. Though the preferred treatment temperature range depends on the density and shape of the metal mesh pattern or metal wiring pattern, the type of binder, etc., the temperature is more preferably 10° C. (without temperature control) to 50° C. in general.

[Treatment with Vapor Contact]

In the production method of the present embodiment, the conductive patterns may be brought into contact with a vapor in a vapor contact step after the smoothing treatment. In the vapor contact step, the smoothed conductive patterns 108 may be brought into contact with a superheated vapor or with a pressurized vapor (or a pressurized saturated vapor). The conductivity and transparency can be readily improved in a short time by this step. In this step, a water-soluble binder may be partly removed, so that the bindings between the conductive metal substances may be increased.

In the production method of this embodiment, the conductive patterns 108 are preferably water-washed after the treatment with the superheated or pressurized vapor. The binder dissolved or embrittled by the superheated or pressurized vapor can be removed by the water washing after the vapor contact treatment, to improve the conductivity.

[Plating Treatment]

In this embodiment, the conductive patterns 108 may be subjected to a plating treatment in addition to the smoothing treatment. By the plating treatment, the surface resistance can be further lowered to improve the conductivity. The smoothing treatment may be carried out before or after the plating treatment. When the smoothing treatment is carried out before the plating treatment, the plating treatment can be more efficiently carried out to form a uniform plated layer. The plating treatment may be an electrolytic or electroless treatment. The material for the plated layer is preferably a metal with a sufficient conductivity such as copper.

[Oxidation Treatment]

In this embodiment, the conductive patterns 108 formed by the development treatment or the conductive metal portions formed by the plating treatment is preferably subjected to an oxidation treatment. For example, by the oxidation treatment, a small amount of a metal deposited on the light-transmitting portion can be removed, so that the transmittance of the light-transmitting portion can be increased to approximately 100%.

Several preferred properties of the resultant conductive film 100 will be described below.

[First Silver Image 104a and Second Silver Image 104b]

The line width of each conductive pattern 108 in the first silver image 104a and the second silver image 104b is 10 µm or less. In the touch panel, in view of preventing the generation of moire, the line width is preferably 5 to 10 µm, more preferably 5 to 9 µm, further preferably 5 to 8 µm. The conductive pattern 108 may have a part with a line width of more than 10 µm for the purpose of connection to a control IC circuit, connection to ground, etc.

Particularly in the case of using the conductive film 100 in the touch panel, it is preferred that the first silver image 104a and the second silver image 104b have the lattice conductive patterns 108 composed of a plurality of polygons, the lattice conductive patterns 108 have an arrangement pitch of 300 µm or less and a total light transmittance of 80% or more, and the difference between the opening ratio of the first silver image 104a and the opening ratio of the second silver image 104b is 1% or less. The term "the opening ratio of the first silver image 104a" as used herein means the opening ratio of the effective area on the one main surface of the transparent support 102 (the effective area excluding the outer periphery on which the first silver image 104a is not disposed), and the term "the opening ratio of the second silver image 104b" as used herein means the opening ratio of the effective area on the other main surface of the transparent support 102 (the effective area excluding the outer periphery on which the second silver image 104b is not disposed). The opening ratio of the first silver image 104a is the ratio of the light-transmitting portions (other than the conductive patterns 108) to the entire surface of the first silver image 104a, and the opening ratio of the second silver image 104b is the ratio of the light-transmitting portions (other than the conductive patterns 108) to the entire surface of the second silver image 104b.

[Light-Transmitting Portion]

In this embodiment, in the conductive film 100, the light-transmitting portions are areas having a light transmission property other than the conductive patterns 108. As described above, the transmittance of the light-transmitting portion, which is herein a minimum transmittance value in a wavelength region of 380 to 780 nm obtained neglecting the light absorption and reflection of the transparent support 102, is 90% or more, preferably 95% or more, more preferably 97% or more, further preferably 98% or more, most preferably 99% or more.

[Conductive Film 100]

In the conductive film 100 of this embodiment, the thickness of the transparent support 102 is preferably 5 to 350 µm, more preferably 30 to 150 µm. When the thickness is 5 to 350 µm, a desired visible light transmittance can be obtained, and the transparent support 102 can be easily handled.

The thicknesses of the conductive patterns 108 formed on the transparent support 102 may be appropriately selected by controlling the thicknesses of the first photosensitive layer 120a and the second photosensitive layer 120b applied to the transparent support 102. In the case of using the conductive film 100 in the touch panel, the conductive pattern 108 preferably has a smaller thickness. As the thickness is reduced, the viewing angle and visibility of the display panel are improved. Thus, the thickness of each conductive pattern 108 is preferably 0.5 to 3 µm, more preferably 1.0 to 2.5 µm.

The plating or the like is not necessarily carried out in the method for producing the conductive film 100 of this embodiment. This is because the desired surface resistance can be obtained by controlling the applied silver amounts and the silver/binder volume ratios of the first photosensitive layer 120a and the second photosensitive layer 120b in this method for producing the conductive film 100 according to the present embodiment. The calender treatment or the like may be carried out if necessary.

The present invention may be appropriately combined with technologies described in the following patent publications and international patent pamphlets shown in Tables 1 and 2. "Japanese Laid-Open Patent", "Publication No.", "Pamphlet No.", etc. are omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153  | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |

TABLE 1-continued

| | | | | |
|---|---|---|---|---|
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

The present invention will be described more specifically below with reference to Examples. Materials, amounts, ratios, treatment contents, treatment procedures, and the like, used in Examples, may be appropriately changed without departing from the scope of the present invention. The following specific examples are therefore to be considered in all respects as illustrative and not restrictive.

In Examples 1 to 13, the surface resistance values, thicknesses, applied silver amounts, and silver/binder volume ratios of the first photosensitive layer 120a and the second photosensitive layer 120b formed on the transparent support 102 were changed thereby to evaluate the shape, conductivity, and moire generation of the conductive patterns 108. The properties and evaluation results of Examples 1 to 13 are shown in Table 3.

Example 1

(Photosensitive Silver Halide Material)

An emulsion containing an aqueous medium, a gelatin, and silver iodobromochloride particles was prepared. The amount of the gelatin was 20.0 g per 150 g of Ag, and the silver iodobromochloride particles had an I content of 0.2 mol %, a Br content of 40 mol %, and an average spherical equivalent diameter of 0.1 μm.

$K_3Rh_2Br_9$ and $K_2IrCl_6$ were added to the emulsion at a concentration of $10^{-7}$ mol/mol-silver to dope the silver bromide particles with Rh and Ir ions. The emulsion and a gelatin hardener were applied to the transparent support 102 composed of a polyethylene terephthalate (PET). The applied silver amount was 8 g/m², the coverage of the silver halide particles with the spectral sensitizing dye was 20% or less, and the silver/binder (gelatin) volume ratio was 1/1. The applied emulsion had a surface resistance value (log SR) of 15 and a high contrast photographic property with a gamma of 4 or more.

The transparent support 102 had a width of 30 cm, and the emulsion was applied thereto into a width of 25 cm and a length of 20 m. The both edge portions having a width of 3 cm were cut off to obtain a roll photosensitive silver halide material having a width of 24 cm.

(Exposure)

The exposure patterns 132a and 132b of the first photomask 126a and the second photomask 126b for the simultaneous both-side exposure were such that lattice patterns containing a large number of squares are arranged at a pitch of 300 μm. The connection point (intersection) of the exposure pattern 132b was positioned at the center of the lattice pattern of the exposure pattern 132a. The photosensitive silver halide material was exposed to a parallel light from a light source of a high-pressure mercury lamp through the first photomask 126a and the second photomask 126b having the exposure patterns 132a and 132b. A sample of Comparative Example 1 was produced by adjusting the exposure line widths of the photomasks.

Furthermore, in a case where the light-transmitting conductive layer containing the net-like structure composed of the thin wires was used in a touch panel sensor, the exposure was performed by use of a pattern corresponding to the sensor and a silver wire circuit, the pattern being obtained by incorporating, into the exposure mask, a pattern of wires extending from the sensor to the control IC circuit.

(Development)

| Formulation of 1 L of developer | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | Controlled at 10.3 |
| Formulation of 1 L of fixer | |
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| Potassium iodide | 2 g |
| pH | Controlled at 6.2 |

The exposed photosensitive material was treated with the above treatment agents under the following development treatment conditions using an automatic processor FG-710PTS manufactured by FUJIFILM Corporation. In this process, development was carried out at 35° C. for 30 seconds, fixation was carried out at 34° C. for 23 seconds, and then water washing was carried out for 20 seconds at a water flow rate of 5 L/min. A conductive film having a large number of the conductive patterns 108 (the lattice squares) on each surface of the transparent support 102 was produced by this process.

Examples 2 and 3

Conductive films of Examples 2 and 3 were produced in the same manner as Example 1 except that the silver/binder volume ratios of the emulsions were 2/1 and 3/1 respectively.

Examples 4 to 6

Conductive films of Examples 4 to 6 were produced in the same manner as Example 1 except that the silver/binder volume ratios of the emulsions were 3/1 (Example 5) and 4/1 (Examples 4 and 6) and that the surface resistance values (log SR) of the emulsion layers on the photosensitive silver halide materials were set at 10 (Example 6), 11 (Example 4), and 13 (Example 5) by controlling the salt concentration of the emulsions.

Examples 7 to 9

Conductive films of Examples 7, 8, and 9 were produced in the same manner as Example 1 except that the surface resistance values (log SR) of the emulsion layers on the photosensitive silver halide materials were 13 and that the applied silver amounts were 5, 15, and 20 g/m² respectively.

Examples 10 and 11

Conductive films of Examples 10 and 11 were produced in the same manner as Examples 2 and 3 except that the surface resistance values (log SR) of the emulsion layers on the photosensitive silver halide materials were 13 and that the applied silver amounts were 20 g/m².

Examples 12 and 13

Conductive films of Examples 12 and 13 were produced in the same manner as Example 5 except that the applied silver amounts were 15 g/m² on the photosensitive silver halide material and that the amounts of the polyethylene glycol 2000 were 2 and 3 g in the developers for the development treatment respectively.

Thus, in each example, a value was calculated using the formula: {(lower line width−upper line width)/upper line width}×100. If the calculated value was less than 3%, the example was evaluated as "Excellent". If it was at least 3% but less than 5%, the example was evaluated as "Good". If it was 5% or more, the example was evaluated as "Poor".

<Evaluation of Conductivity of Conductive Layer in Net-Like Structure>

The sheet resistance of the conductive patterns 108 was measured. Specifically, the sheet resistance values were measured on ten areas by LORESTA GP (Model No. MCP-T610) manufactured by Dia Instruments Co., Ltd. utilizing an four-pin probe method (QPP), and the average of the measured values was determined as the sheet resistance.

If the sheet resistance of the conductive patterns 108 was 10 ohm/sq or less, the example was evaluated as "Excellent". If it was more than 10 ohm/sq but at most 50 ohm/sq, it was evaluated as "Good". If it was more than 50 ohm/sq, it was evaluated as "Poor".

TABLE 3

| | | | Silver halide emulsion properties | | | | | | | |
|---|---|---|---|---|---|---|---|---|---|---|
| | Line | Sheet | Surface resistance | | Applied silver | Silver/ binder | | Evaluation | | |
| | width (μm) | resistance (Ω) | value (logSR) | Thickness (μm) | amount (g/m²) | (volume ratio) | Gamma | Pattern shape | Conductivity | Moire | Dust attachment |
| Comp. 1 | 12 | 25 | 15 | 1.5 | 8 | 1/1 | 4 | Good | Good | Poor | Good |
| Ex. 1 | 10 | 25 | 15 | 1.5 | 8 | 1/1 | 4 | Good | Good | Good | Good |
| Ex. 2 | 9 | 15 | 15 | 1.1 | 8 | 2/1 | 4.5 | Good | Good | Good | Good |
| Ex. 3 | 9 | 10 | 15 | 1.0 | 8 | 3/1 | 4.5 | Good | Good | Good | Good |
| Ex. 4 | 9 | 5 | 11 | 0.9 | 8 | 4/1 | 4.5 | Good | Excellent | Good | Excellent |
| Ex. 5 | 9 | 10 | 13 | 1.0 | 8 | 3/1 | 4.5 | Good | Good | Good | Good |
| Ex. 6 | 9 | 5 | 10 | 0.9 | 8 | 4/1 | 4.5 | Good | Excellent | Good | Excellent |
| Ex. 7 | 9 | 45 | 13 | 0.9 | 5 | 1/1 | 4.5 | Good | Good | Good | Good |
| Ex. 8 | 9 | 15 | 13 | 2.8 | 15 | 1/1 | 4.5 | Excellent | Good | Good | Good |
| Ex. 9 | 9 | 10 | 13 | 3.8 | 20 | 1/1 | 4.5 | Excellent | Good | Good | Good |
| Ex. 10 | 9 | 7 | 13 | 2.8 | 20 | 2/1 | 4.5 | Excellent | Excellent | Good | Good |
| Ex. 11 | 9 | 3 | 13 | 2.5 | 20 | 3/1 | 4.5 | Excellent | Excellent | Good | Good |
| Ex. 12 | 8 | 5 | 13 | 1.9 | 15 | 3/1 | 5 | Excellent | Excellent | Good | Good |
| Ex. 13 | 7 | 5 | 13 | 1.9 | 15 | 3/1 | 5.5 | Excellent | Excellent | Excellent | Good |

In Examples 1 to 13, the conductive patterns 108 had an arrangement pitch of 300 μm, a thickness of 2.5 μm or less, an upper line width of 10 μm or less, and a total light transmittance of 80% or more. Furthermore, the conductive patterns 108 exhibited a difference of 1% or less between the opening ratio of the effective area on the one main surface of the transparent support 102 (the area other than the outer periphery on which the first silver image 104a was not disposed) and the opening ratio of the effective area on the other main surface of the transparent support 102 (the area other than the outer periphery on which the second silver image 104b was not disposed).

[Evaluation]

<Evaluation of Conductive Pattern Shape>

As shown in FIG. 5, in the simultaneous both-side exposure, when a scattered light generated from the second light 124b of the second light source 128b reaches the first photosensitive layer 120a formed on the one main surface, a large area at the boundary between the first photosensitive layer 120a and the transparent support 102 is exposed thereby to form the latent images 134. As a result, as shown in FIG. 6, the thin conductive layers 136 are formed between the conductive patterns 108 due to the second light 124b from the second light source 128b. In this case, the line width of a lower portion of the conductive patterns 108 is larger than that of an upper portion thereof.

<Evaluation of Resistance of Wiring Pattern>

The resistance (per 10 mm length) of the silver wire electrically connected to the net-like structure was measured using a multimeter such as a digital multimeter manufactured by Yokogawa Electric Corporation. In all Examples, the silver wire had a resistance of 300 ohm or less per 10 mm.

<Evaluation of Moire>

The conductive film 100 was attached to a display screen of a liquid crystal display device. The display device was fixed to a turntable and then operated to display a white color. The moire of the conductive film 100 was visually observed and evaluated while turning the turntable within a bias angle range of −45° to +45°.

The moire was observed at a distance of 1.5 m from the display screen of the liquid crystal display device. If the moire was not visible, the conductive film 100 was evaluated as "Excellent". If the moire was slightly visible to an acceptable extent, the conductive film 100 was evaluated as "Good". If the moire was highly visible, the conductive film 100 was evaluated as "Poor".

<Evaluation of Electric Resistance (SR) of Photosensitive Silver Halide Material>

The surface electric resistance (SR) was measured in accordance with a resistivity method described in JIS-K-

6911-1979. The measurement was carried out after each photosensitive material was placed in a humidity control atmosphere of 23° C. and 65% RH for 6 hours.

<Evaluation of Dust Attachment>

Each sample was processed into a long film having a width of 18 cm, and was placed in an atmosphere of 25° C. and 65% RH for 3 days. Thereafter, the long film was conveyed at a line speed of 100 m/min by using a handling mechanism (a processing simulator). Then, the dust attachment on the film surface was evaluated by visual observation.

Excellent: The dust attachment was not observed.
Good: The dust attachment was slightly observed.
Poor: The dust attachment was observed.

<Evaluation Result>

In all Examples 1 to 13, the conductive patterns 108 exhibited satisfactory evaluation results in shape, conductivity, and moire. In Examples 8 to 13 using the applied silver amounts of 20 and 15 g/m$^2$, the conductive patterns 108 exhibited "Excellent" results in the shape evaluation.

Furthermore, in Examples 4, 5, and 6 using the emulsions with the surface resistance values (log SR) of 11, 13 and 10, respectively, the conductive patterns 108 exhibited "Excellent" results in the conductivity evaluation.

In addition, in Examples 1 to 11 using the line widths of 9 and 10 μm, the conductive patterns 108 exhibited "Good" results in the moire evaluation. Further, in Examples 12 and 13 using the line widths of 8 μm or less, the conductive patterns 108 exhibited "Excellent" results in the moire evaluation.

Though the calender treatment and the vapor contact treatment were not carried out in Examples 1 to 13, it is apparent that the conductivities can be further improved by the calender and vapor contact treatments.

It is to be understood that the conductive film and the method for the conductive film according to the present invention are not limited to the above embodiments, and various changes and modifications may be made therein without departing from the scope of the present invention.

What is claimed is:

1. A conductive film comprising a transparent support, a first conductive silver image disposed on one main surface of the transparent support, and a second conductive silver image disposed on another main surface of the transparent support, the first and second conductive silver images being obtained by forming at least one silver halide emulsion layer on each of the surfaces of the transparent support and then exposing and developing the silver halide emulsion layer,
wherein the first silver image and the second silver image each contain a net-like structure in a region required to be transparent,
the net-like structure comprises thin wires having a line width of 10 μm or less, and
the net-like structure forms a conductive layer having a sheet resistance of 50 ohm/sq or less.

2. The conductive film according to claim 1, wherein the conductive layer has a sheet resistance of 10 ohm/sq or less.

3. The conductive film according to claim 1, wherein
the first silver image and the second silver image each contain the net-like structure and a silver wire electrically connected to the net-like structure, and
the silver wire has a width of 10 to 500 μm and a length of 10 mm or more, and has a resistance of 300 ohm or less per 10 mm.

4. The conductive film according to claim 3, wherein the silver wire has a resistance of 100 ohm or less per 10 mm.

5. The conductive film according to claim 1, wherein the silver halide emulsion layer has a silver/binder volume ratio of 1/1 or more.

6. The conductive film according to claim 1, wherein the silver halide emulsion layer has a silver/binder volume ratio of 2/1 or more.

7. The conductive film according to claim 1, wherein the silver halide emulsion layer is not substantially spectrally-sensitized and has a surface resistance value (logSR) of 15 or less and an applied silver amount of 5 to 30 g/m$^2$.

8. The conductive film according to claim 7, wherein the silver halide emulsion layer has an applied silver amount of 15 to 30 g/m$^2$.

9. The conductive film according to claim 7, wherein the silver halide emulsion layer contains silver halide particles, and surfaces of the silver halide particles are covered with a spectral sensitizing dye at a coverage of 20% or less.

10. The conductive film according to claim 7, wherein the silver halide emulsion layer has a surface resistance value (logSR) of 13 or less.

11. The conductive film according to claim 1, wherein
the net-like structure comprises a lattice pattern containing a plurality of polygons,
the lattice pattern has an arrangement pitch of 300 μm or less and a total light transmittance of 80% or more, and
a difference between an opening ratio of an effective area on the one main surface of the transparent support, the effective area excluding an outer periphery on which the first silver image is not disposed, and an opening ratio of an effective area on the other main surface of the transparent support, the effective area excluding an outer periphery on which the second silver image is not disposed, is 1% or less.

12. The conductive film according to claim 1, wherein the first silver image and the second silver image each have a portion that forms an electrode for a touch panel.

13. A method for producing a conductive film having a transparent support, a first conductive silver image disposed on one main surface of the transparent support, and a second conductive silver image disposed on another main surface of the transparent support, the method comprising the steps of:
forming at least one silver halide emulsion layer on each of the surfaces of the transparent support;
exposing the silver halide emulsion layer; and
developing the exposed silver halide emulsion layer,
wherein the first silver image and the second silver image each contain a net-like structure in a region required to be transparent,
the net-like structure comprises thin wires having a line width of 10 μm or less,
the net-like structure forms a conductive layer having a sheet resistance of 50 ohm/sq or less, and
the silver halide emulsion layer on each of the surfaces is not substantially spectrally-sensitized and has a thickness of 4 μm or less, an applied silver amount of 5 g/m$^2$ or more, and an applied binder amount of 2.0 g/m$^2$ or less.

14. The method according to claim 13, wherein the silver halide emulsion layer has an applied silver amount of 15 to 30 g/m$^2$.

15. The method according to claim 13, wherein the conductive layer has a sheet resistance of 10 ohm/sq or less.

16. The method according to claim 13, wherein the first silver image and the second silver image each contain the net-like structure and a silver wire electrically connected to the net-like structure, and the silver wire has a width of 10 to 500 μm and a length of 10 mm or more, and has a resistance of 300 ohm or less per 10 mm.

17. The method according to claim 16, wherein the silver wire has a resistance of 100 ohm or less per 10 mm.

18. The method according to claim 13, wherein the silver halide emulsion layer contains silver halide particles, and the surfaces of the silver halide particles are covered with a spectral sensitizing dye at a coverage of 20% or less.

19. The method according to claim 13, wherein the exposing step is carried out using an exposure mask in close contact with the silver halide emulsion layer.

20. The method according to claim 13, wherein the silver halide emulsion layer has a high contrast photographic property.

21. The method according to claim 13, wherein the silver halide emulsion layer is formed as a substantially uppermost layer.

* * * * *